US011659766B2

(12) United States Patent
Lee et al.

(10) Patent No.: US 11,659,766 B2
(45) Date of Patent: May 23, 2023

(54) ORGANIC SEMICONDUCTOR MATERIAL FOR ELECTRON TRANSPORT

(71) Applicant: DAEGU GYEONGBUK INSTITUTE OF SCIENCE & TECHNOLOGY, Daegu (KR)

(72) Inventors: Youn Gu Lee, Daegu (KR); Seok Hoon Jang, Daegu (KR)

(73) Assignee: Daegu Gyeongbuk Institute of Science & Technology, Daegu (KR)

(*) Notice: Subject to any disclaimer, the term of this patent is extended or adjusted under 35 U.S.C. 154(b) by 122 days.

(21) Appl. No.: 16/019,525

(22) Filed: Jun. 26, 2018

(65) Prior Publication Data
US 2019/0189933 A1 Jun. 20, 2019

(30) Foreign Application Priority Data
Dec. 19, 2017 (KR) .................. 10-2017-0175584

(51) Int. Cl.
*H01L 51/00* (2006.01)
*H01L 51/50* (2006.01)
(52) U.S. Cl.
CPC ........ *H01L 51/0074* (2013.01); *H01L 51/007* (2013.01); *H01L 51/0067* (2013.01); *H01L 51/0073* (2013.01); *H01L 51/5004* (2013.01); *H01L 51/5016* (2013.01); *H01L 51/5072* (2013.01)

(58) Field of Classification Search
CPC ............ H01L 51/0062; H01L 51/0065; H01L 51/0068; H01L 51/0071; H01L 51/0073; H01L 51/0074; H01L 51/0069; H01L 51/0067; H01L 51/5016; H01L 51/5072; H01L 51/007; H01L 51/5004; C07D 333/50; C07D 333/76; C07D 307/00; C07D 307/77; C07D 307/91; C07D 307/92; C07D 405/14; C07D 405/04; C07D 405/10; C07D 407/04
See application file for complete search history.

(56) References Cited

U.S. PATENT DOCUMENTS

| | | | | |
|---|---|---|---|---|
| 2010/0213443 A1* | 8/2010 | Sapochak | ............ | H01L 51/0059 257/40 |
| 2011/0272687 A1* | 11/2011 | Katakura | ............. | C07D 519/00 257/40 |
| 2011/0285276 A1* | 11/2011 | Kadoma | ................ | H05B 33/14 313/504 |
| 2012/0130081 A1* | 5/2012 | Kawata | ................ | H01L 51/007 548/145 |
| 2013/0048964 A1* | 2/2013 | Takeda | ................... | C09K 11/06 257/E51.026 |
| 2013/0256646 A1* | 10/2013 | Fennimore | ........... | C07D 401/14 252/301.16 |
| 2014/0048789 A1* | 2/2014 | Park | ........................ | C09B 57/00 257/40 |
| 2014/0239269 A1* | 8/2014 | Jeong | .................. | H01L 51/0072 257/40 |
| 2015/0034927 A1* | 2/2015 | Nakano | ............... | H01L 51/0073 257/40 |
| 2016/0329506 A1* | 11/2016 | Lee | ........................ | C07D 405/14 |
| 2017/0062736 A1* | 3/2017 | Parham | ................ | A61N 5/0616 |
| 2017/0186965 A1* | 6/2017 | Parham | ............... | H01L 51/0073 |
| 2017/0244049 A1* | 8/2017 | Aspuru-Guzik | ..... | C07D 471/04 |
| 2017/0373256 A1* | 12/2017 | Ko | ......................... | C09K 11/025 |

FOREIGN PATENT DOCUMENTS

| | | | | |
|---|---|---|---|---|
| CN | 104726090 | A | * | 6/2015 |
| CN | 106316925 | A | * | 1/2017 |
| JP | 2008060379 | A | * | 3/2008 |
| JP | 2013149880 | A | * | 8/2013 |
| JP | 2014103103 | A | * | 6/2014 |
| KR | 100681027 | B1 | | 2/2007 |
| KR | 2012-0129733 | A | | 11/2012 |
| KR | 20130080826 | A | * | 7/2013 |
| KR | 20130083887 | A | * | 7/2013 |
| KR | 20130093195 | A | * | 8/2013 |
| KR | 2013-0100264 | A | | 9/2013 |

(Continued)

OTHER PUBLICATIONS

KR-20130080826-A—translation (Year: 2013).*

(Continued)

*Primary Examiner* — Jennifer A Boyd
*Assistant Examiner* — Braelyn R Watson
(74) *Attorney, Agent, or Firm* — Harness, Dickey & Pierce, P.L.C.

(57) ABSTRACT

One embodiment of the present invention provides an organic semiconductor material for electron transport. The organic semiconductor material for electron transport may have a structure represented by the following Formula 1:

Formula 1

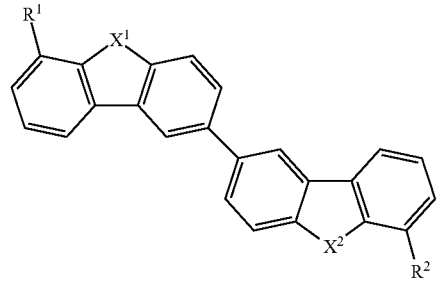

wherein $X^1$ and $X^2$ each independently represent oxygen (O) or sulfur (S) and $R^1$ and $R^2$ each may independently contain a pyridine group, a dipyridylbenzene group, a fluoropyridine group, a diphenylthiazole group, a diphenyloxazole group, a triphenyldiazole group, a phenylthiadiazole group, a phenyloxadiazole group, a diphenyltriazole group, a pyrimidine group, a pyrimidylbenzene group, a phenylpyrimidine group, a diphenylphosphine oxide group, a diphenyltriazine group or a phenyltetrazine group.

12 Claims, 30 Drawing Sheets

(56) References Cited

FOREIGN PATENT DOCUMENTS

KR    2015-0083385 A      7/2015
KR     20160064433 A  *   6/2016

OTHER PUBLICATIONS

CN-104726090-A—Translation (Year: 2015).*
CN-106316925-A—Translation (Year: 2017).*
JP-2008060379-A—Translation (Year: 2008).*
Lee, Chil Won, et al. "The Effect of the Substitution Position of Dibenzofuran on the Photophysical and Charge-Transport Properties of Host Materials for Phosphorescent Organic Light-Emitting Diodes." Chemistry—A European Journal 19.4 (2013): 1194-1198. (Year: 2013).*
English translation of KR 20160064433 A obtained from Google Patents (Year: 2016).*
Li, Hui, et al. "New conducting polymers functionalized with redox-active tetrazines." Journal of Electroanalytical Chemistry 668 (2012): 26-29. (Year: 2012).*
English translation of KR 20130093195 A obtained from Google Patens (Year: 2013).*
English translation of JP 2014103103 A obtained from Global Dossier (Year: 2014).*
English translation of JP 2013149880 A obtained from Global Dossier (Year: 2013).*
English translation of KR20130083887A obtained from Google Patents (Year: 2013).*
Decision to Grant dated Aug. 20, 2020, issued in corresponding Korean Patent Application No. 10-2017-0175584.

* cited by examiner

ORGANIC SEMICONDUCTOR MATERIAL FOR ELECTRON TRANSPORT

CLAIM FOR PRIORITY

This application claims priority to Korean Patent Application No. 10-2017-0175584 filed on Dec. 19, 2017 in the Korean Intellectual Property Office (KIPO), the entire contents of which are hereby incorporated by reference.

BACKGROUND OF THE INVENTION

Field of the Invention

The present invention relates to an organic semiconductor material, particularly to an organic semiconductor material for electron transport.

Description of the Related Art

An organic light emitting diode (OLED) has attracted attention as a next generation display due to its self-luminescent properties and its ability to realize flexible displays using an organic material instead of a metal. The organic light emitting diode is composed of a hole injection layer (HIL), a hole transport layer (HTL), an emissive layer (EML), an electron transport layer (ETL), and an electron injection layer (EIL). In order to develop a phosphorescent OLED device with high efficiency and long life, it is essential to develop an electron transport layer material that effectively transfers electrons injected from the cathode to the emissive layer to improve the OLED device properties, as well as a phosphorescent material.

Electron transport layer materials for OLEDs should have high triplet energy as well as the physical properties required for conventional electron transport layer materials. Therefore, it is necessary to develop a novel electron transport layer material for phosphorescent OLEDs capable of optimizing electron mobility, easy hole blocking and electron injection, thermal stability, and high triplet energy, in order to commercialize high performance blue phosphorescent OLED devices.

CITATION LIST

Patent Literature

Patent Literature 1: Korean Patent No. 10-0681027

SUMMARY OF THE INVENTION

An object of the present invention is to provide an organic semiconductor material for electron transport having high triplet energy.

Objects of the present invention are not limited to the object described above, and other objects that are not described will be clearly understood by a person skilled in the art from the description below.

In order to achieve the above object, one embodiment of the present invention provides an organic semiconductor material for electron transport.

The organic semiconductor material for electron transport may have a structure represented by the following Formula 1:

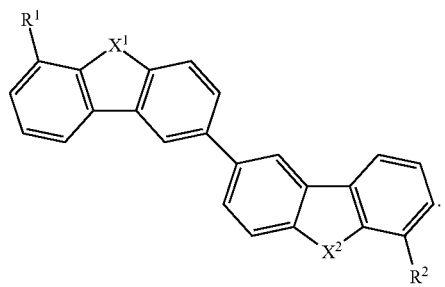

Formula 1

In Formula 1, $X^1$ and $X^2$ each independently represent oxygen (O) or sulfur (S).

In Formula 1, $R^1$ and $R^2$ each may independently contain a pyridine group, a dipyridylbenzene group, a fluoropyridine group, a diphenylthiazole group, a diphenyloxazole group, a triphenyldiazole group, a phenylthiadiazole group, a phenyloxadiazole group, a diphenyltriazole group, a pyrimidine group, a pyrimidylbenzene group, a phenylpyrimidine group, a diphenylphosphine oxide group, a diphenyltriazine group or a phenyltetrazine group.

The pyridine group may be selected from the groups represented by the following Formula 2:

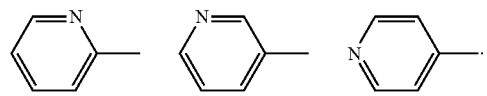

Formula 2

The dipyridylbenzene group may be selected from the groups represented by the following Formula 3:

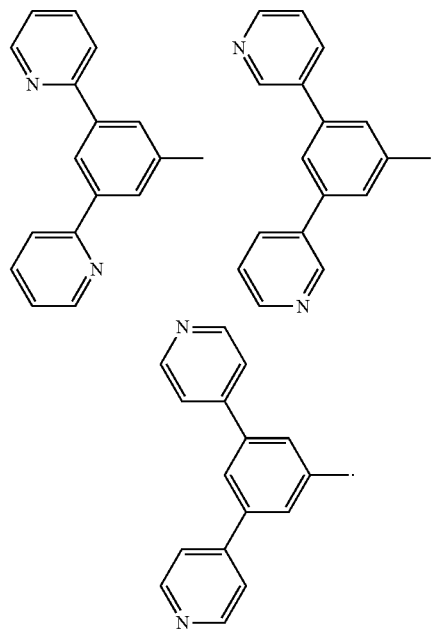

Formula 3

The fluoropyridine group may be selected from the groups represented by the following Formula 4:

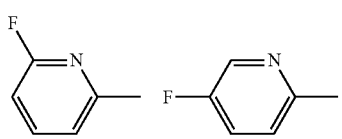

Formula 4

-continued
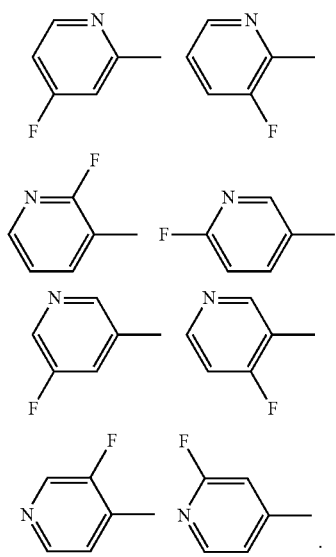
The diphenylthiazole group may be selected from the groups represented by the following Formula 5:
Formula 5
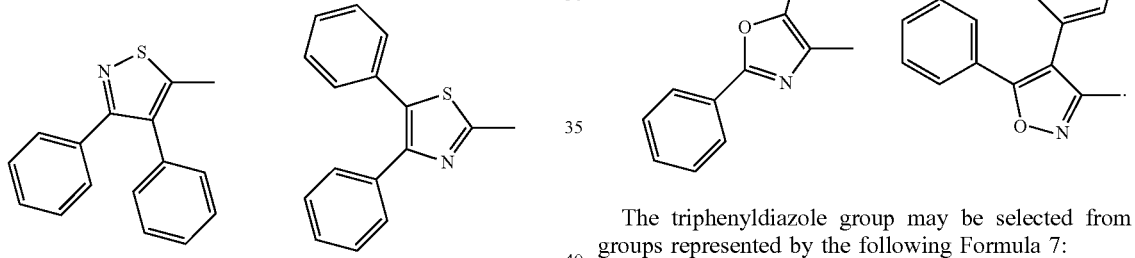
The diphenyloxazole group may be selected from the groups represented by the following Formula 6:
Formula 6
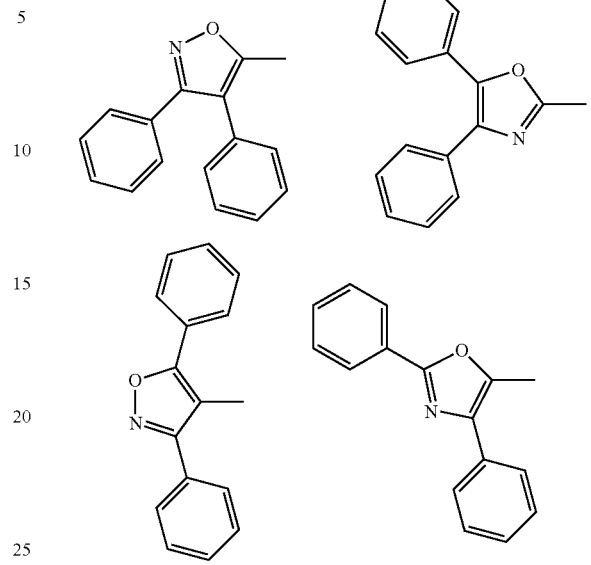
The triphenyldiazole group may be selected from the groups represented by the following Formula 7:
Formula 7
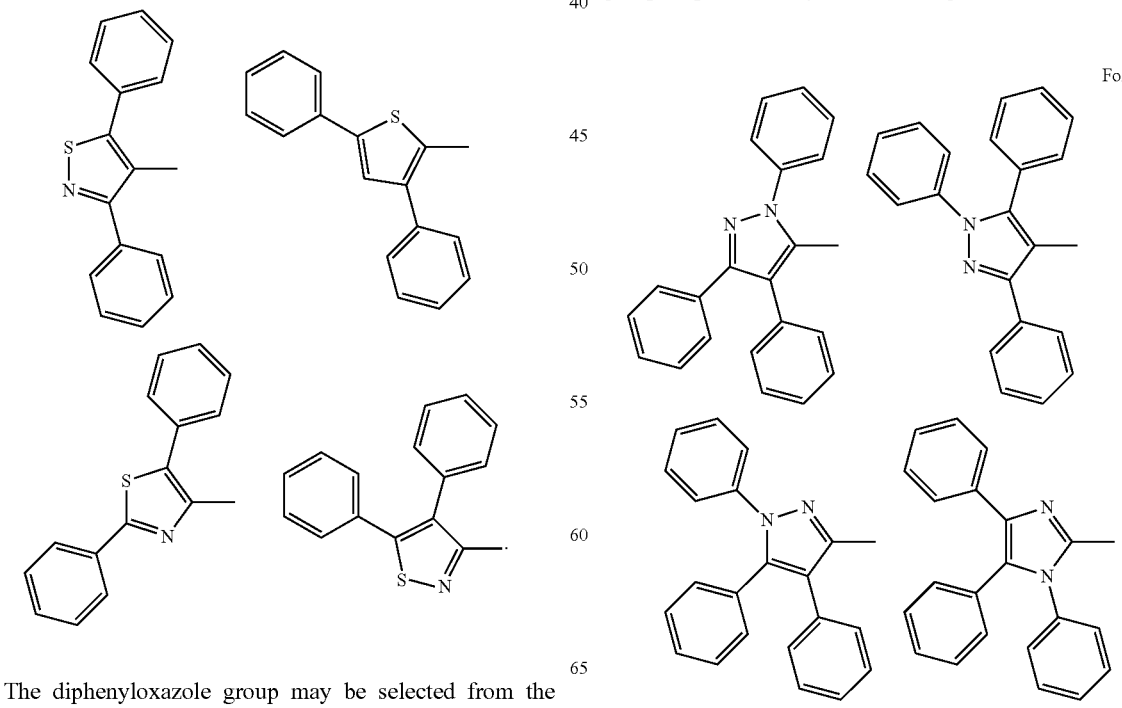

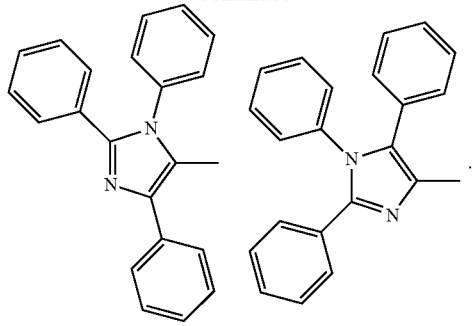

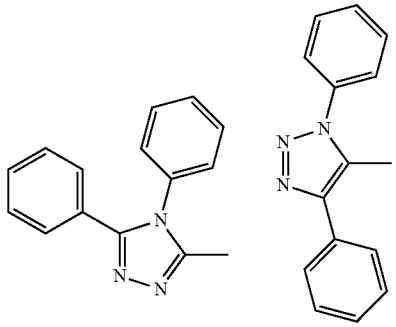

The phenylthiadiazole group may be selected from the groups represented by the following Formula 8:

Formula 8

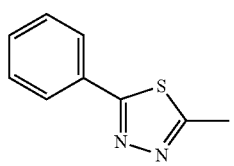 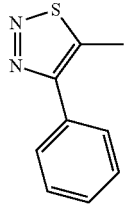 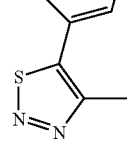

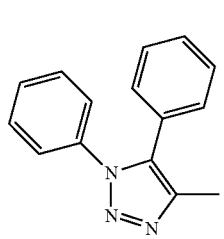 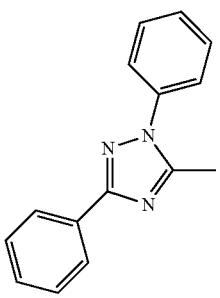

The phenyloxadiazole group may be selected from the groups represented by the following Formula 9:

Formula 9

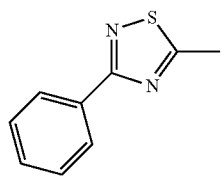 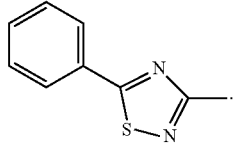

The pyrimidine group may be represented by the following Formula 11:

Formula 11

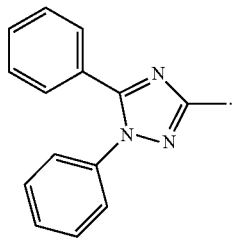

The pyrimidylbenzene group may be selected from the groups represented by the following Formula 12:

Formula 12

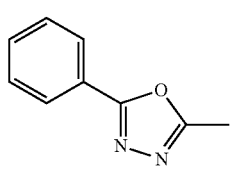 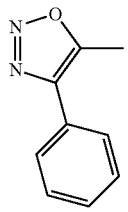 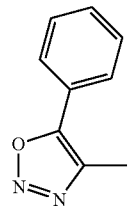

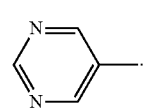

The diphenyltriazole group may be selected from the groups represented by the following Formula 10:

 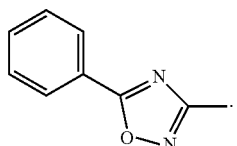

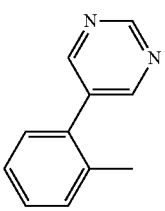 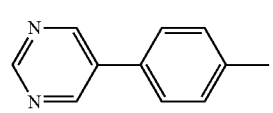

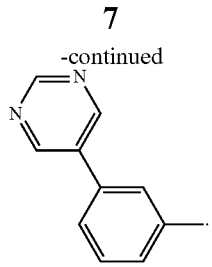

The phenylpyrimidine group may be selected from the groups represented by the following Formula 13:

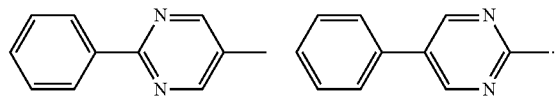

Formula 13

The diphenylphosphine oxide group may be represented by the following Formula 14:

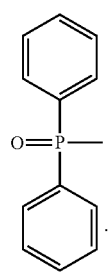

Formula 14

The diphenyltriazine group may be represented by the following Formula 15:

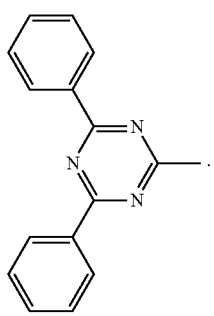

Formula 15

The phenyltetrazine group may be represented by the following Formula 16:

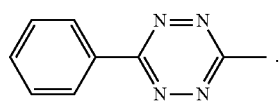

Formula 16

The pyridine group, the dipyridylbenzene group, the fluoropyridine group, the diphenylthiazole group, the diphenyloxazole group, the triphenyldiazole group, the phenylthiadiazole group, the phenyloxadiazole group, the diphenyltriazole group, the pyrimidine group, the pyrimidylbenzene group, the phenylpyrimidine group, the diphenylphosphine oxide group, the diphenyltriazine group or the phenyltetrazine group may be unsubstituted or substituted with a substituent.

The substituent is at least one selected from the group consisting of —OH, —NR$_3$R$_4$, —CONR$_3$R$_4$, —COR$_5$, —COOR$_6$ wherein R$_3$ and R$_4$ each independently represent hydrogen, an alkyl group having 1 to 30 carbon atoms, an aryl group having 6 to 30 carbon atoms, or a heteroaryl group having 2 to 30 carbon atoms; R$_5$ represents hydrogen, a hydroxyl group, a halogen, an alkyl group having 1 to 30 carbon atoms, an aryl group having 6 to 30 carbon atoms or a heteroaryl group having 2 to 30 carbon atoms; and R$_6$ represents an alkyl group having 1 to 30 carbon atoms, an aryl group having 6 to 30 carbon atoms, or a heteroaryl group having 2 to 30 carbon atoms, a hydroxyalkyl group having 1 to 30 carbon atoms, a heteroaryl group having 2 to 30 carbon atoms and containing nitrogen or oxygen, a halogen, a nitro group, a cyano group, an alkyl group having 1 to 30 carbon atoms, an alkenyl group having 1 to 30 carbon atoms, an alkynyl group having 1 to 30 carbon atoms, an alkoxy group having 1 to 30 carbon atoms, an alkoxyalkyl group having 1 to 30 carbon atoms, an aryl group having 6 to 30 carbon atoms, an arylalkyl group having 6 to 30 carbon atoms and a cycloalkyl group having 5 to 30 carbon atoms.

In order to achieve the above object, one embodiment of the present invention provides an organic electronic device comprising the organic semiconductor material.

DETAILED DESCRIPTION OF THE PREFERRED EMBODIMENTS

Figure 1:
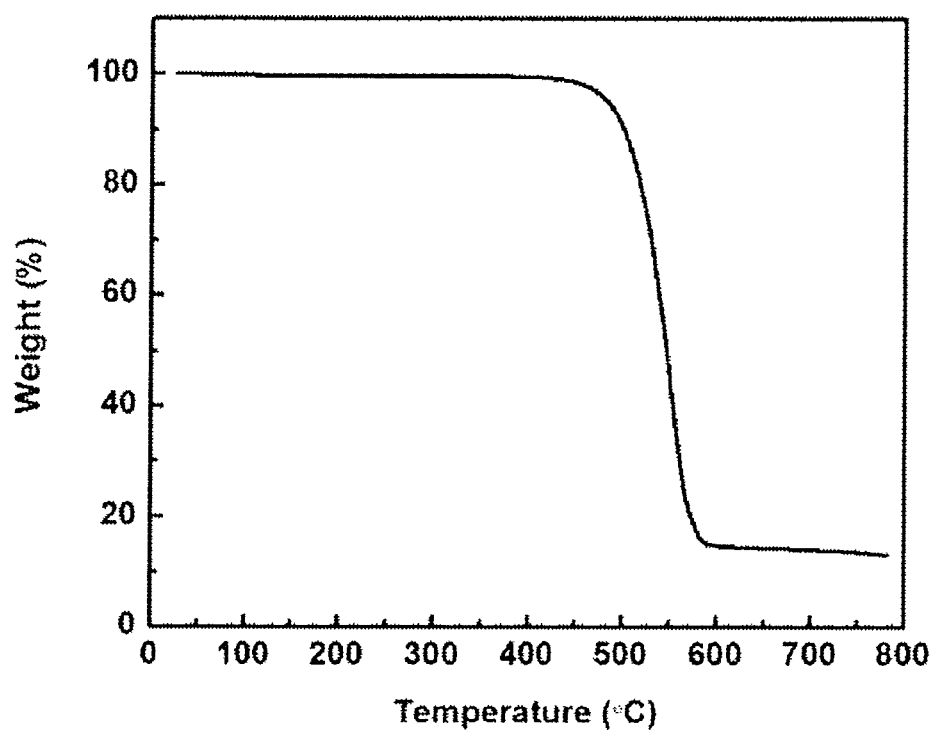
FIG. 1 is a graph of the thermal decomposition temperature measurements of an organic semiconductor material according to one embodiment of the present invention.

Hereinafter, the present invention will be described with reference to the accompanying drawings. The present invention may, however, be embodied in many different forms and should not be construed as limited to the embodiments set forth herein. In order to clearly illustrate the present invention, parts not related to the description are omitted, and like parts are denoted by like reference numerals throughout the specification.

Herein, when a part is described as being "connected" or "coupled" to another part, it may be "directly connected or coupled" to another part or may be "indirectly connected or coupled" to another part with a member interposed therebetween. Further, the terms "comprise" and "include" as used herein refer to the presence of the corresponding component and are not intended to exclude additional components, unless otherwise specified.

The terms as used herein are for the purpose of describing particular embodiments only and are not intended to limit the invention. As used herein, the singular forms "a," "an" and "the" are intended to include the plural forms as well, unless the context clearly indicates otherwise. It is to be further understood that the terms "comprise," "include" and "have" as used herein specify the presence of stated features, numbers, steps, actions, components, parts, or a combination thereof, but do not preclude the presence or addition of one or more other features, numbers, steps, actions, components, parts, or a combination thereof.

Hereinafter, one embodiment of the present invention will be described in detail with reference to the accompanying drawings.

An organic semiconductor material for electron transport according to one embodiment of the present invention will be described below.

The organic semiconductor material for electron transport may have a structure represented by the following Formula 1:

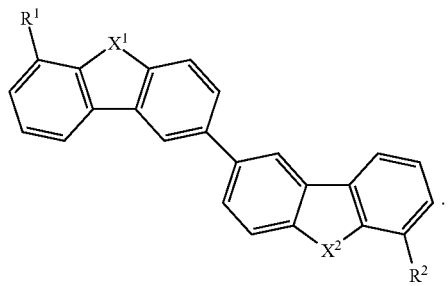

Formula 1

In Formula 1, $X^1$ and $X^2$ each independently represent oxygen (O) or sulfur (S).

In this case, the organic semiconductor material can realize high triplet energy due to the basic structure of a dimer of dibenzofuran or dibenzothiol.

In Formula 1, $R^1$ and $R^2$ each may independently contain a pyridine group, a dipyridylbenzene group, a fluoropyridine group, a diphenylthiazole group, a diphenyloxazole group, a triphenyldiazole group, a phenylthiadiazole group, a phenyloxadiazole group, a diphenyltriazole group, a pyrimidine group, a pyrimidylbenzene group, a phenylpyrimidine group, a diphenylphosphine oxide group, a diphenyltriazine group or a phenyltetrazine group.

In this case, the organic semiconductor material can achieve high electron mobility due to an electron-deficient group as a substituent.

Preferably, the organic semiconductor material may comprise a dipyridylbenzene group, a pyrimidylbenzene group, a phenylpyrimidine group, a diphenylphosphine oxide group, a diphenyltriazine group or a phenyltetrazine group, a diphenylthiazole group, a diphenyloxazole group, a triphenyldiazole group, a phenylthiadiazole group, a phenyloxadiazole group, or a diphenyltriazole group, which have high electron deficiency.

Electron transport layer materials are used to effectively transfer the electrons injected from the cathode to the emissive layer. Thus, a heteroaromatic compound having electron acceptor properties can be used as an electron transport layer material.

In order for an electron transport layer to inject electrons into an emissive layer, it should have a large HOMO-LUMO gap to effectively block the movement of holes and thus to improve the luminescence properties. Also, the electron transport layer used in phosphorescent devices should have higher triplet energy than the triplet exciton generated in the emissive layer.

In addition, it is preferable that organic semiconductor materials for electron transport exhibit high electron mobility, easy hole blocking and electron injection, and high thermal stability.

The pyridine group may be selected from the groups represented by the following Formula 2:

Formula 2

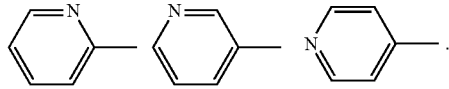

The dipyridylbenzene group may be selected from the groups represented by the following Formula 3:

Formula 3

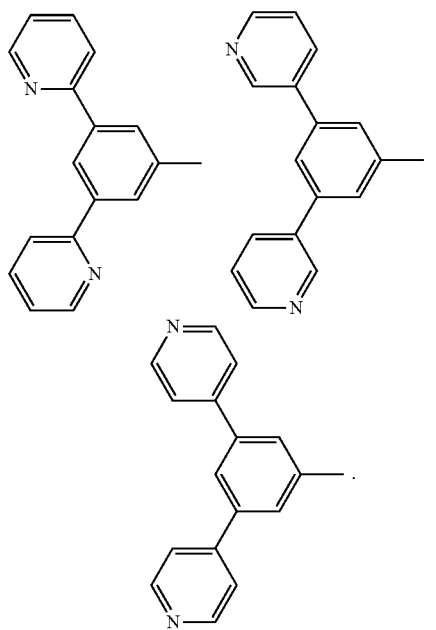

The fluoropyridine group may be selected from the groups represented by the following Formula 4:

Formula 4

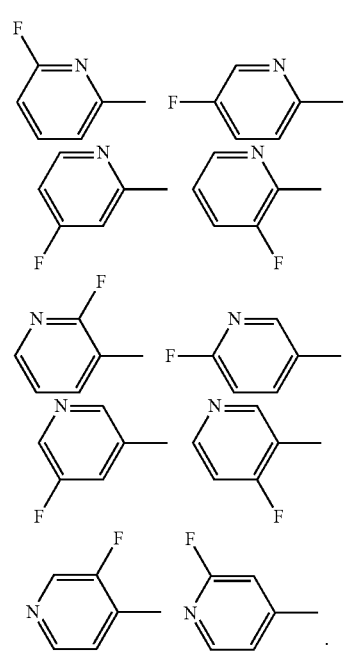

The diphenylthiazole group may be selected from the groups represented by the following Formula 5:

Formula 5

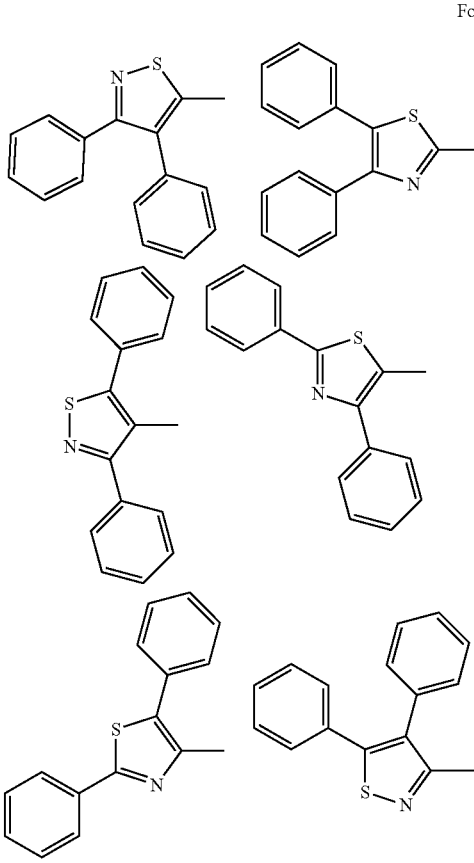

The diphenyloxazole group may be selected from the groups represented by the following Formula 6:

Formula 6

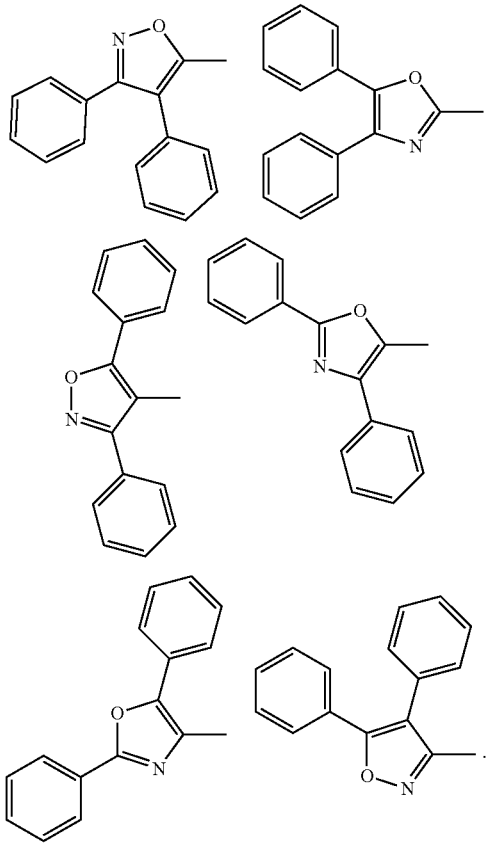

The triphenyldiazole group may be selected from the groups represented by the following Formula 7:

Formula 7

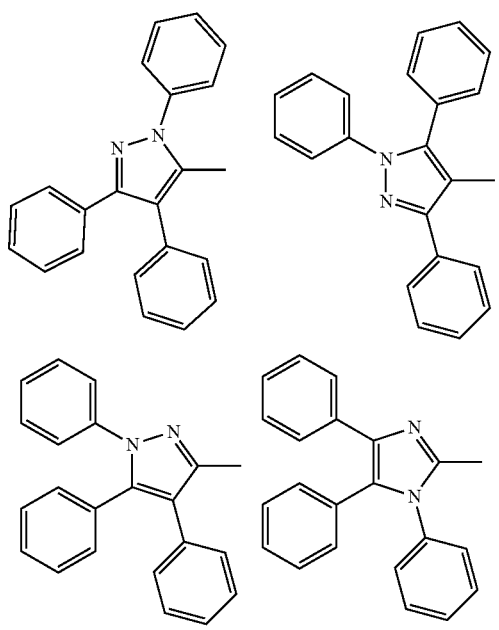

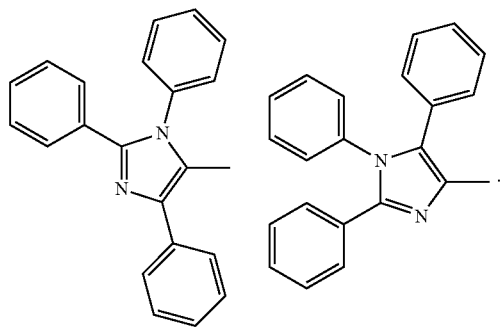

The phenylthiadiazole group may be selected from the groups represented by the following Formula 8:

Formula 8

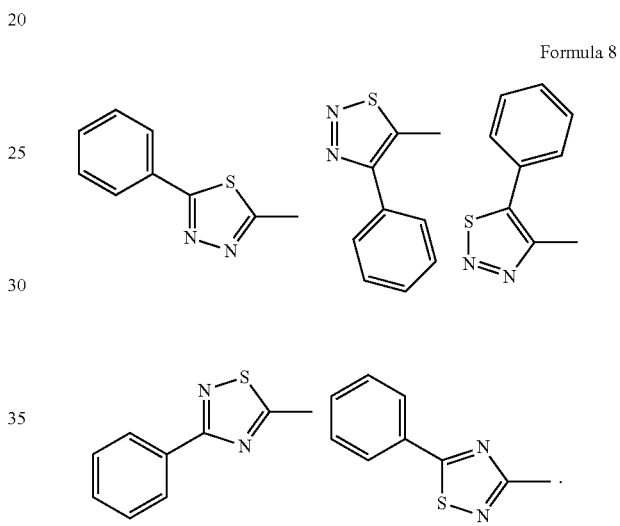

The phenyloxadiazole group may be selected from the groups represented by the following Formula 9:

Formula 9

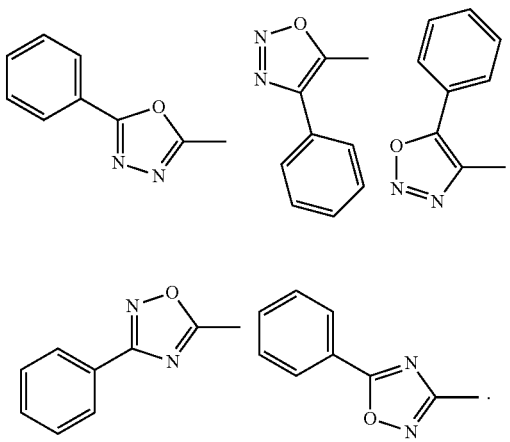

The diphenyltriazole group may be selected from the groups represented by the following Formula 10:

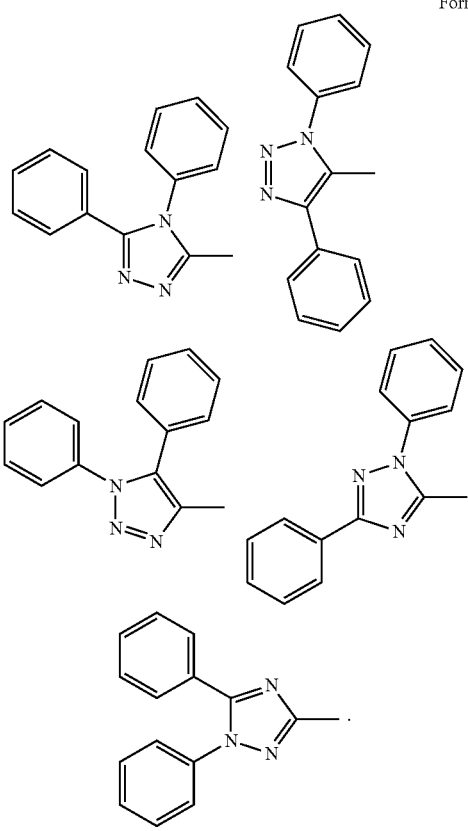

Formula 10

The pyrimidine group may be represented by the following Formula 11:

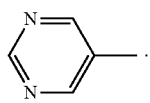

Formula 11

The pyrimidylbenzene group may be selected from the groups represented by the following Formula 12:

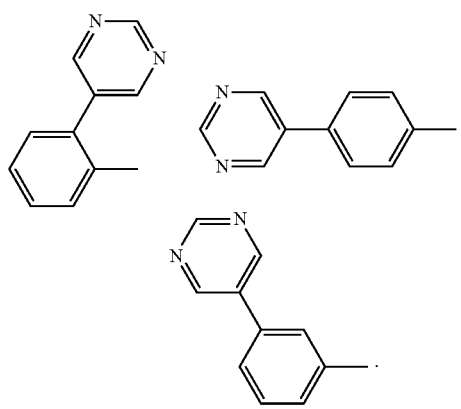

Formula 12

The phenylpyrimidine group may be selected from the groups represented by the following Formula 13:

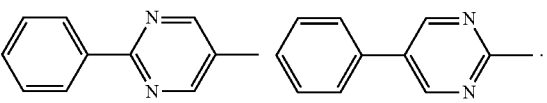

Formula 13

The diphenylphosphine oxide group may be represented by the following Formula 14:

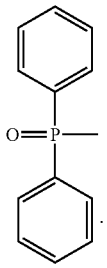

Formula 14

The diphenyltriazine group may be represented by the following Formula 15:

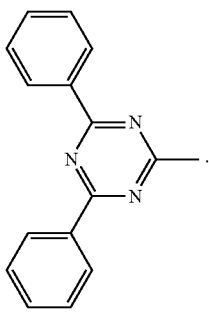

Formula 15

The phenyltetrazine group may be represented by the following Formula 16:

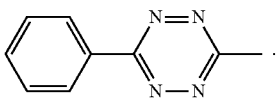

Formula 16

The pyridine group, the dipyridylbenzene group, the fluoropyridine group, the diphenylthiazole group, the diphenyloxazole group, the triphenyldiazole group, the phenylthiadiazole group, the phenyloxadiazole group, the diphenyltriazole group, the pyrimidine group, the pyrimidylbenzene group, the phenylpyrimidine group, the diphenylphosphine oxide group, the diphenyltriazine group or the phenyltetrazine group may be unsubstituted or substituted with a substituent.

The substituent is not particularly limited but is preferably at least one selected from the group consisting of —OH, —NR$_3$R$_4$, —CONR$_3$R$_4$, —COR$_5$, —COOR$_6$ wherein R$_3$ and R$_4$ each independently represent hydrogen, an alkyl group having 1 to 30 carbon atoms, an aryl group having 6 to 30 carbon atoms, or a heteroaryl group having 2 to 30 carbon atoms; R$_5$ represents hydrogen, a hydroxyl group, a halogen, an alkyl group having 1 to 30 carbon atoms, an aryl group having 6 to 30 carbon atoms or a heteroaryl group having 2 to 30 carbon atoms; and $R_6$ represents an alkyl group having 1 to 30 carbon atoms, an aryl group having 6 to 30 carbon atoms, or a heteroaryl group having 2 to 30 carbon atoms, a hydroxyalkyl group having 1 to 30 carbon atoms, a heteroaryl group having 2 to 30 carbon atoms and containing nitrogen or oxygen, a halogen, a nitro group, a cyano group, an alkyl group having 1 to 30 carbon atoms, an alkenyl group having 1 to 30 carbon atoms, an alkynyl group having 1 to 30 carbon atoms, an alkoxy group having 1 to 30 carbon atoms, an alkoxyalkyl group having 1 to 30 carbon atoms, an aryl group having 6 to 30 carbon atoms, an arylalkyl group having 6 to 30 carbon atoms and a cycloalkyl group having 5 to 30 carbon atoms.

Examples 1

Compound 1 as an organic semiconductor material according to one embodiment of the present invention was synthesized.

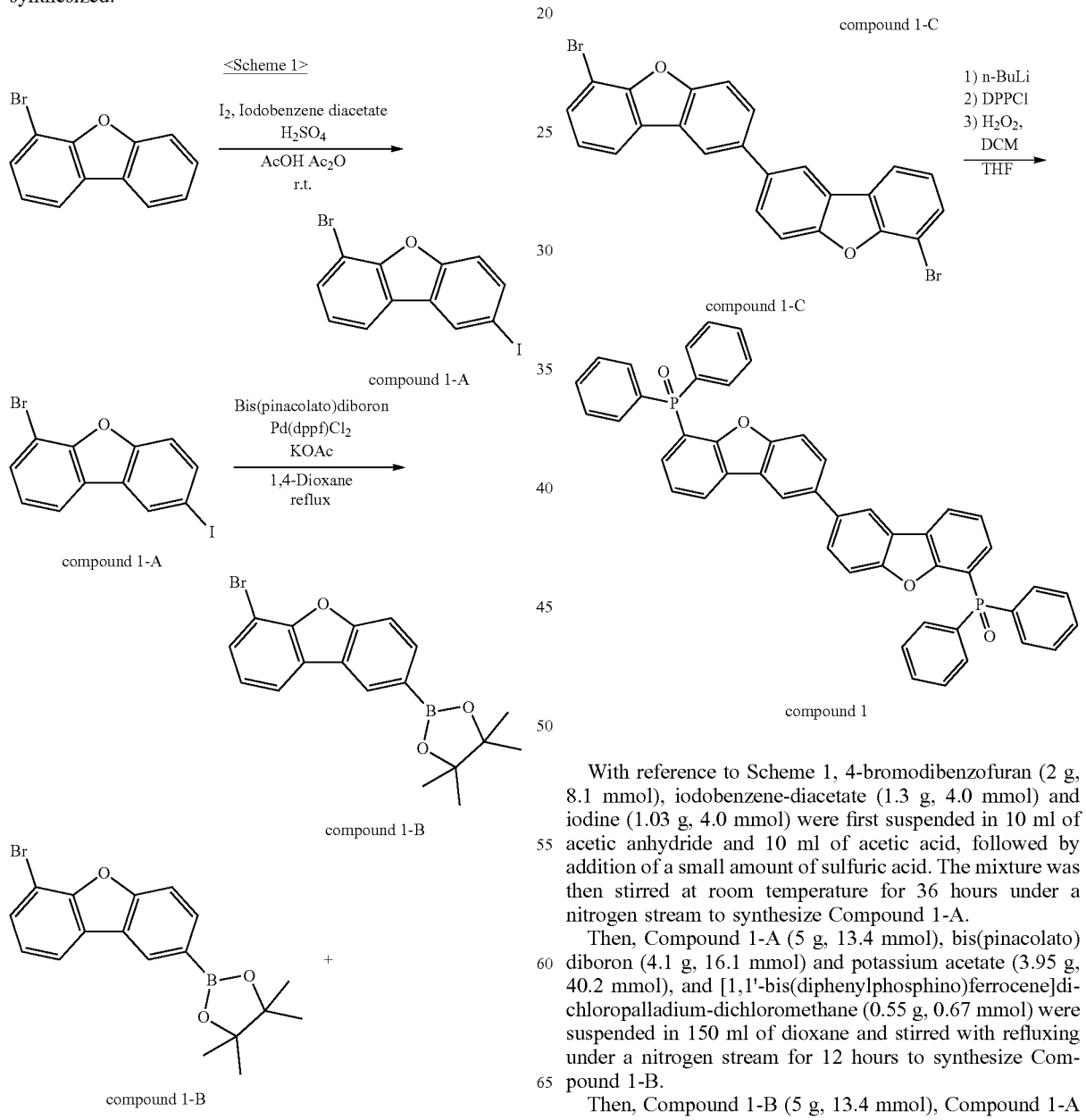

With reference to Scheme 1, 4-bromodibenzofuran (2 g, 8.1 mmol), iodobenzene-diacetate (1.3 g, 4.0 mmol) and iodine (1.03 g, 4.0 mmol) were first suspended in 10 ml of acetic anhydride and 10 ml of acetic acid, followed by addition of a small amount of sulfuric acid. The mixture was then stirred at room temperature for 36 hours under a nitrogen stream to synthesize Compound 1-A.

Then, Compound 1-A (5 g, 13.4 mmol), bis(pinacolato) diboron (4.1 g, 16.1 mmol) and potassium acetate (3.95 g, 40.2 mmol), and [1,1'-bis(diphenylphosphino)ferrocene]dichloropalladium-dichloromethane (0.55 g, 0.67 mmol) were suspended in 150 ml of dioxane and stirred with refluxing under a nitrogen stream for 12 hours to synthesize Compound 1-B.

Then, Compound 1-B (5 g, 13.4 mmol), Compound 1-A (5 g, 13.4 mmol) and sodium carbonate (2.84 g, 26.8 mmol), and tetrakis(triphenylphosphine)palladium (0.77 g, 0.67 mmol) were suspended in 100 ml of dioxane and 50 ml of distilled water. The mixture was then stirred with refluxing under a nitrogen stream for 12 hours to synthesize Compound 1-C.

Then, Compound 1-C (3 g, 6.10 mmol) was dissolved in 100 ml of tetrahydrofuran and cooled to −78° C. 2M n-butyllithium (5.85 ml, 14.6 mmol) was slowly added dropwise and stirred for 2.5 hours, and diphenylphosphine chloride (3.23 g, 14.6 mmol) was slowly added dropwise at −78° C. Then, the reactants were stirred at room temperature for 12 hours to synthesize Compound 1.

FIG. 1 is a graph of the thermal decomposition temperature measurements of an organic semiconductor material according to one embodiment of the present invention.

From FIG. 1, it can be understood that Compound 1 according to one embodiment of the present invention is decomposed at about 484° C. This shows that the organic semiconductor material according to one embodiment of the present invention is stable even at a high temperature.

Figure 2:
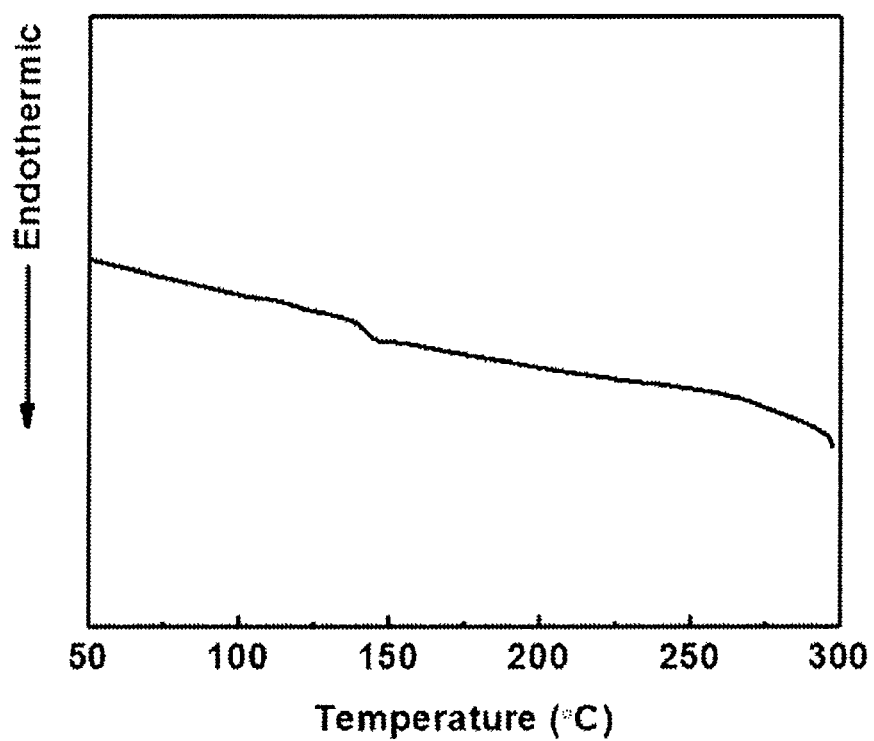
FIG. 2 is a graph showing the changes in the calorific value of an organic semiconductor material according to one embodiment of the present invention.

FIG. 2 is a graph showing the changes in the calorific value of an organic semiconductor material according to one embodiment of the present invention.

From FIG. 2, it can be understood that Compound 1 according to one embodiment of the present invention has a glass transition temperature of about 142° C., which is about two times higher than the glass transition temperature of conventional electron transport layer materials of 79° C. This shows that the organic semiconductor material according to one embodiment of the present invention can maintain the electron transport ability even at a high temperature.

Figure 3:
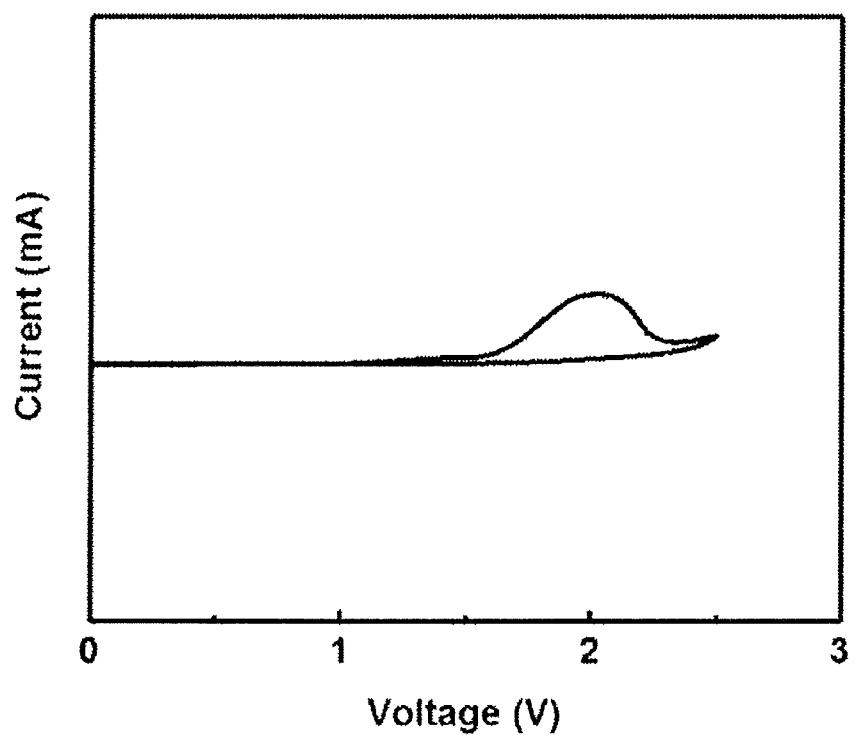
FIG. 3 is a graph of the oxidation potential of an organic semiconductor material according to one embodiment of the present invention.

FIG. 3 is a graph of the oxidation potential of an organic semiconductor material according to one embodiment of the present invention.

From FIG. 3, it can be understood that Compound 1 according to one embodiment of the present invention has a HOMO energy level of −5.90 eV and a LUMO energy level of −2.22 eV and thus has a large HOMO-LUMO gap. This shows that the organic semiconductor material according to one embodiment of the present invention can effectively block the movement of holes.

Figure 4:
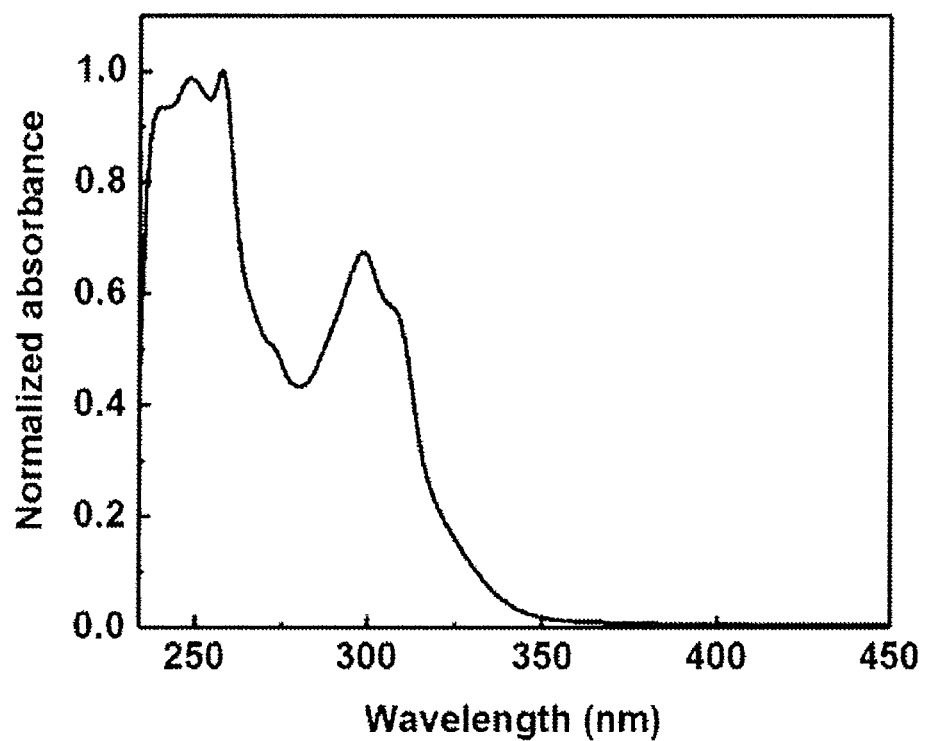
FIG. 4 is a UV-Vis absorption spectrum graph of an organic semiconductor material according to one embodiment of the present invention.

FIG. 4 is a UV-Vis absorption spectrum graph of an organic semiconductor material according to one embodiment of the present invention.

From FIG. 4, it can be understood that the band gap energy of Compound 1 according to one embodiment of the present invention is 6.68 eV. This shows that the organic semiconductor material according to one embodiment of the present invention is suitable for application to blue phosphorescent light emitting diodes.

Figure 5:
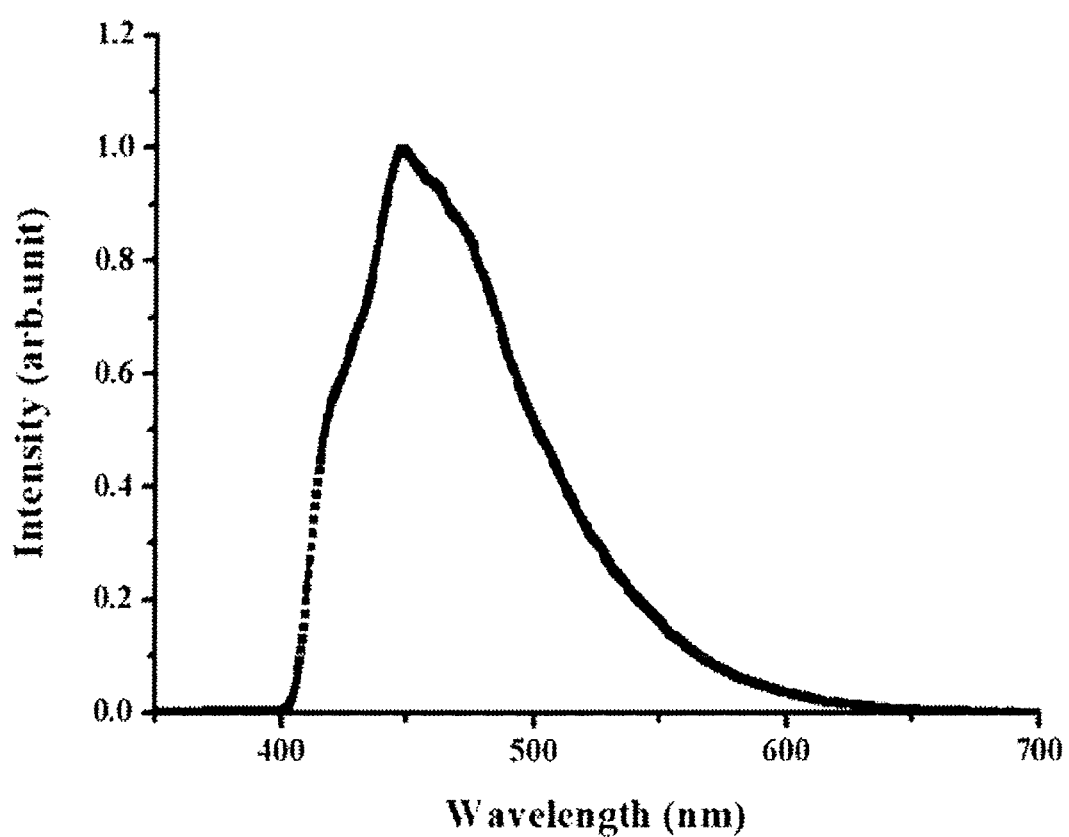
FIG. 5 is a low-temperature PL spectrum graph of an organic semiconductor material according to one embodiment of the present invention.

FIG. 5 is a low-temperature PL spectrum graph of an organic semiconductor material according to one embodiment of the present invention.

From FIG. 5, it can be understood that the triplet energy of Compound 1 according to one embodiment of the present invention is 2.95.eV, which is higher than the triplet energy for application to blue phosphorescent light emitting diodes of 2.80 eV. This shows that the organic semiconductor material according to one embodiment of the present invention is applicable to blue phosphorescent light emitting diodes.

The organic semiconductor material according to one embodiment of the present invention has high thermal stability and high triplet energy and thus is applicable to blue phosphorescent devices and semiconductor devices.

Hereinafter, an organic electronic device comprising the organic semiconductor material according to one embodiment of the present invention will be described.

Figure 6:
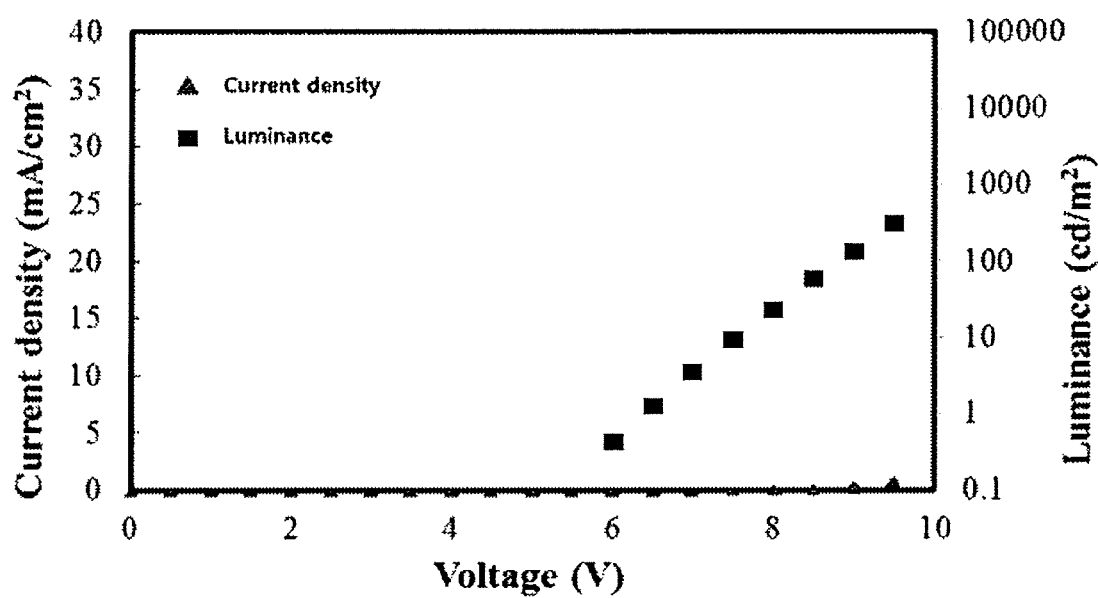
FIG. 6 is a graph of the current density and luminance vs. voltage of an organic light emitting diode according to one embodiment of the present invention.

FIG. 6 is a graph of the current density and luminance vs. voltage of an organic light emitting diode according to one embodiment of the present invention.

From FIG. 6, it can be understood that the luminance increases as the voltage of the organic light emitting diode increases.

Figure 7:
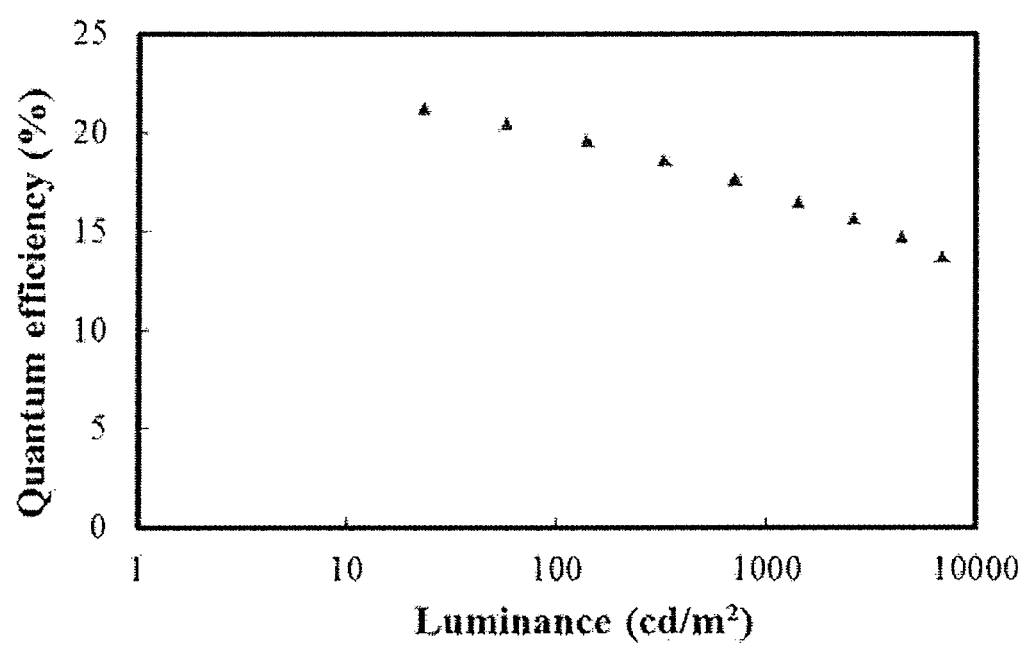
FIG. 7 is a graph of the external quantum efficiency vs. luminance of an organic light emitting diode according to one embodiment of the present invention.

FIG. 7 is a graph of the external quantum efficiency vs. luminance of an organic light emitting diode according to one embodiment of the present invention.

From FIG. 7, it can be understood that although the external quantum efficiency decreases as the luminance of the organic light emitting diode increases, the external quantum efficiency is maintained at around 15% or more even at a strong luminance of 10000 cd/m$^3$.

Figure 8:
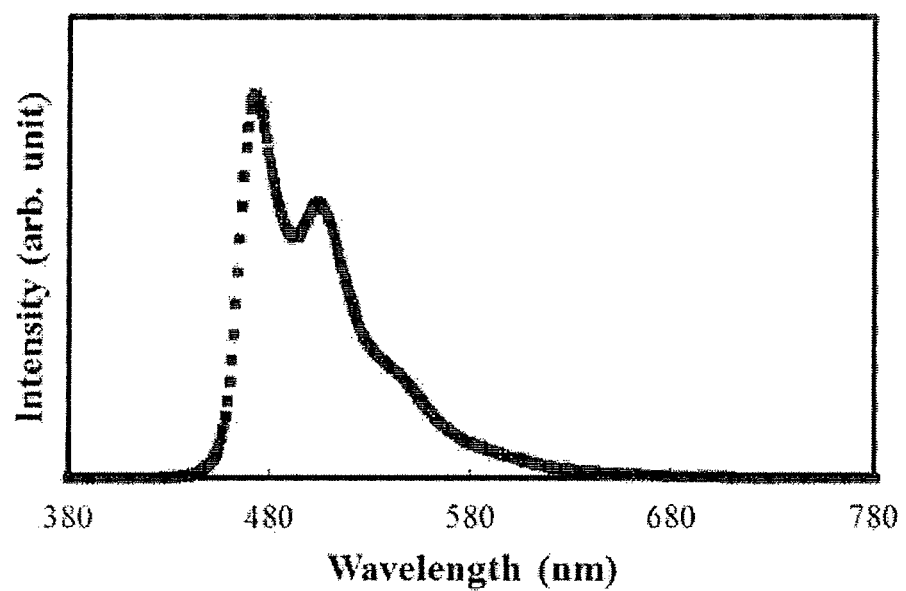
FIG. 8 is an EL spectrum graph of an organic light emitting diode according to one embodiment of the present invention.

FIG. 8 is an EL spectrum graph of an organic light emitting diode according to one embodiment of the present invention.

From FIG. 8, it can be understood that an organic light emitting diode using an organic semiconductor material according to one embodiment of the present invention as an electron transport material emits blue phosphorescence. This shows that the organic semiconductor material according to one embodiment of the present invention is applicable to blue phosphorescent devices.

Figure 9:
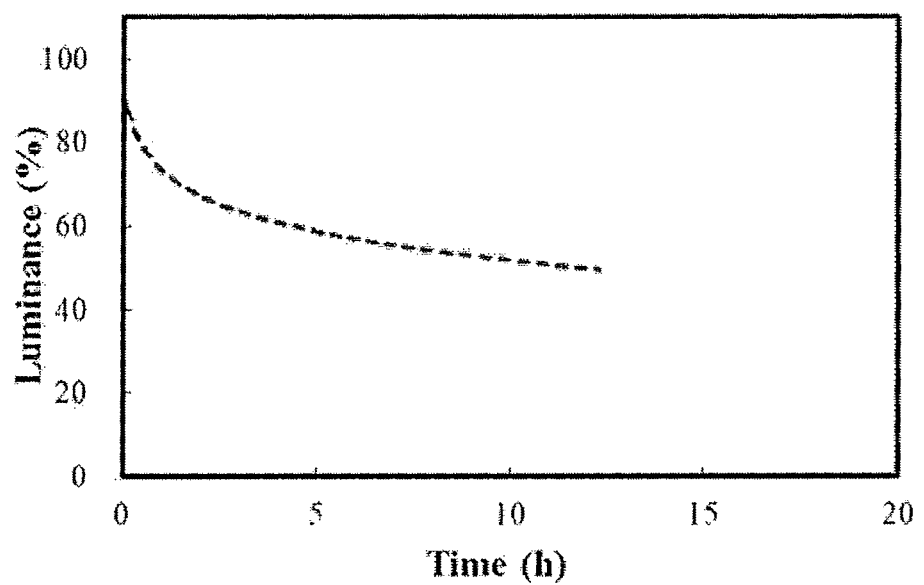
FIG. 9 is a graph showing the luminance changes over time of an organic light emitting diode according to one embodiment of the present invention.

FIG. 9 is a graph illustrating the luminance changes over time of an organic light emitting diode according to one embodiment of the present invention.

From FIG. 9, it can be understood that an organic light emitting diode using an organic semiconductor material according to one embodiment of the present invention as an electron transport material maintains about 50% or more of the luminance even when operated for a long time. This shows that the organic electronic device according to one embodiment of the present invention can be operated for a long time.

From FIG. 6 to FIG. 9, it can be understood that an organic electronic device according to one embodiment of the present invention achieves high thermal stability and high triplet energy by using an organic semiconductor material according to one embodiment of the present invention.

Example 2

Compound 2 as an organic semiconductor material according to one embodiment of the present invention was synthesized.

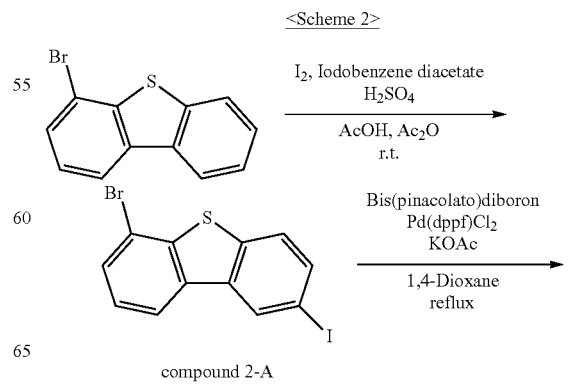

-continued

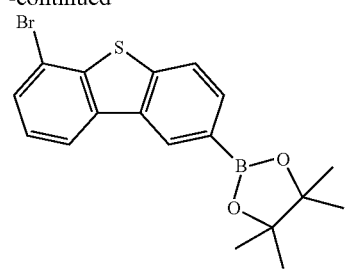

compound 2-B

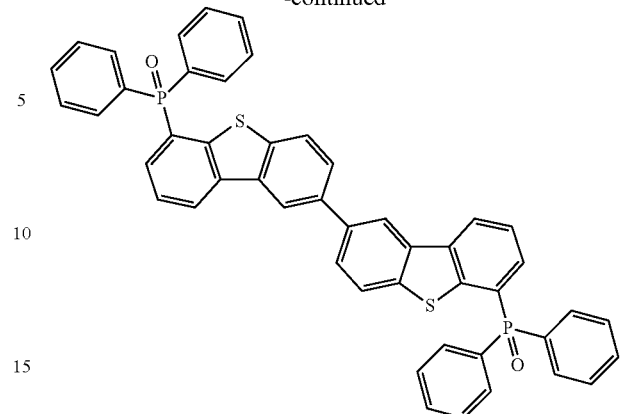

compound 2

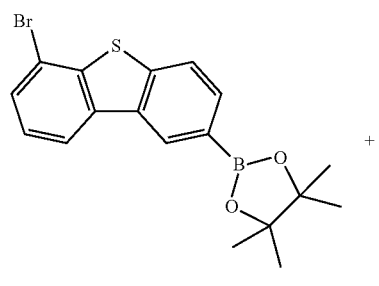

compound 2-B

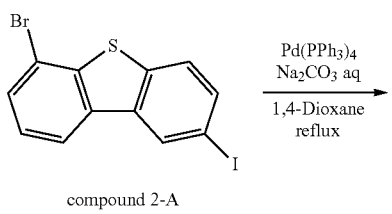

compound 2-A

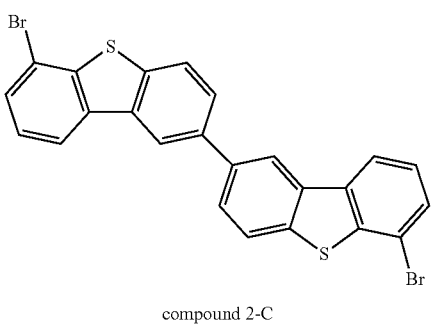

compound 2-C

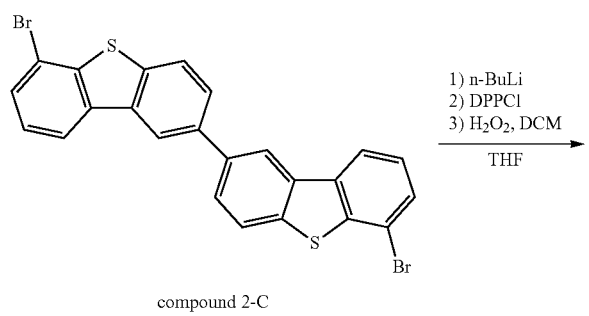

compound 2-C

With reference to Scheme 2, 4-bromodibenzofuran (5.00 g, 19.00 mmol), iodobenzene-diacetate (3.06 g, 9.50 mmol) and iodine (2.41 g, 9.50 mmol) were first suspended in 10 ml acetic anhydride and 10 ml acetic acid, followed by addition of a small amount of sulfuric acid. The mixture was then stirred at room temperature for 36 hours under a nitrogen stream to synthesize Compound 2-A.

Then, Compound 2-A (3.00 g, 7.71 mmol), bis(pinacolato)diboron (2.94 g, 11.57 mmol) and potassium acetate (2.27 g, 23.13 mmol), and [1,1'-bis(diphenylphosphino)ferrocene] dichloropalladium-dichloromethane (0.31 g, 0.39 mmol) were suspended in 150 ml dioxane and stirred with refluxing under a nitrogen stream for 12 hours to synthesize Compound 2-B.

Then, Compound 2-B (3.00 g, 7.71 mmol), Compound 2-A (3.00 g, 7.71 mmol) and sodium carbonate (1.63 g, 15.42 mmol), and tetrakis(triphenylphosphine)palladium (0.45 g, 0.39 mmol) were suspended in 100 ml dioxane and 50 ml distilled water. The mixture was then stirred with refluxing under a nitrogen stream for 12 hours to synthesize Compound 2-C.

Then, Compound 2-C (2.00 g, 3.81 mmol) was dissolved in 100 ml tetrahydrofuran and cooled to −78° C. 2M n-butyllithium (4.27 ml, 10.68 mmol) was slowly added dropwise and stirred for 1.5 hours, and diphenylphosphine chloride (2.19 g, 9.92 mmol) was slowly added dropwise at −78° C. Then, the reaction solution was stirred for 12 hours while maintaining the temperature at room temperature.

Then, 10 ml 30% hydrogen peroxide solution was added to the reaction solution, and the mixture was stirred for 6 hours to synthesize Compound 2.

Figure 10:
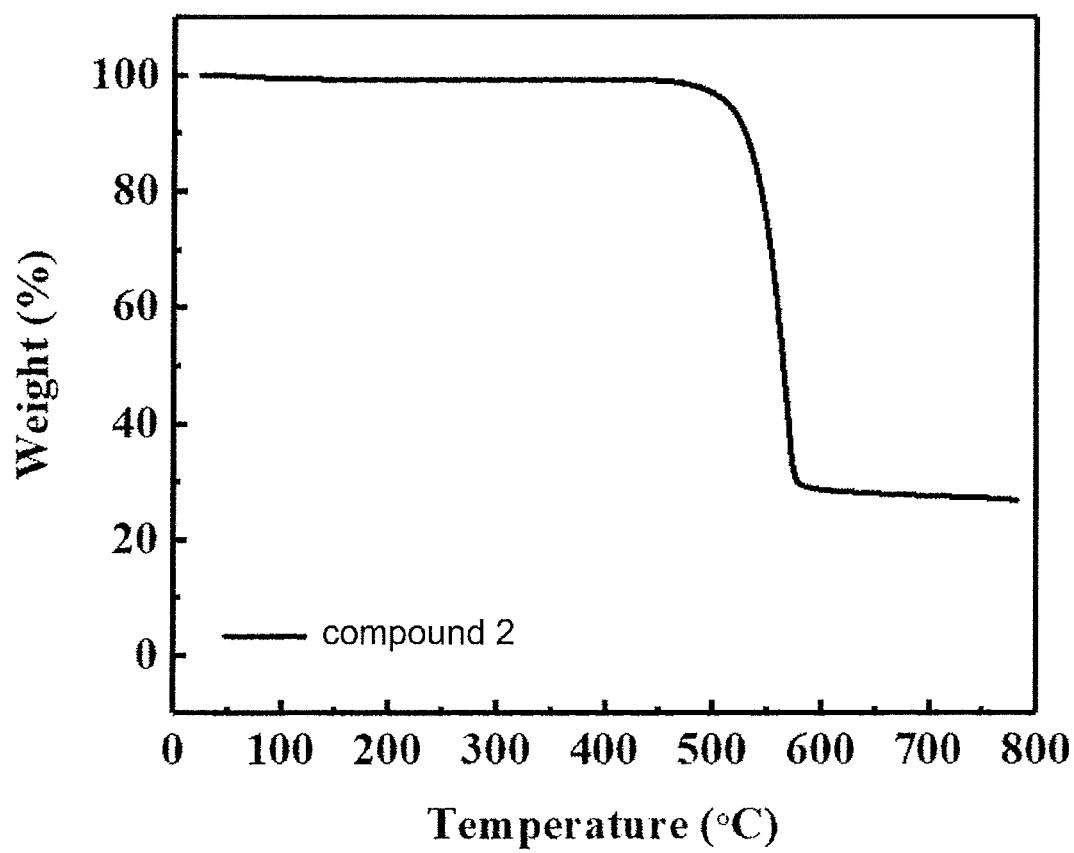
FIG. 10 is a graph of the thermal decomposition characteristics of an organic semiconductor material according to Example 2 of the present invention.

FIG. 10 is a graph of the thermal decomposition characteristics of an organic semiconductor material according to Example 2 of the present invention.

From FIG. 10, it can be understood that Compound 2 according to one embodiment of the present invention is decomposed at about 514° C. This shows that the organic semiconductor material according to one embodiment of the present invention is stable even at a high temperature.

Figure 11:
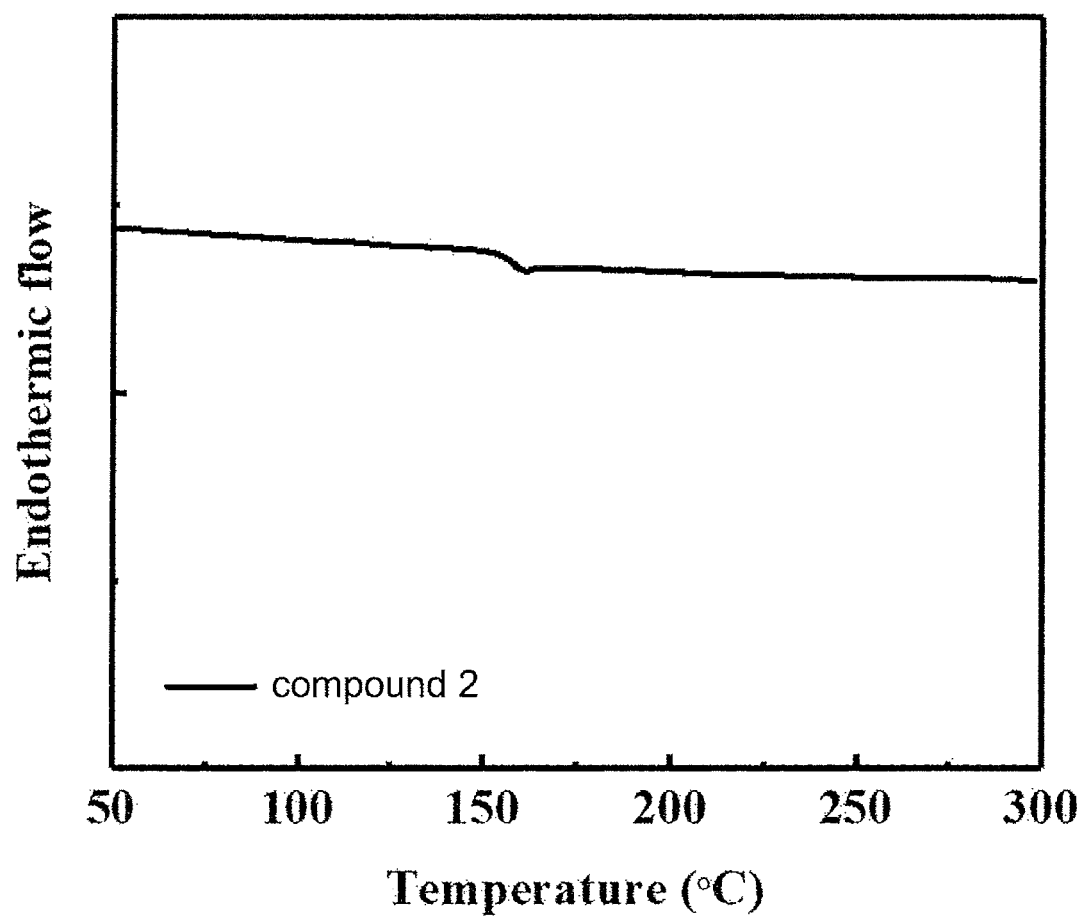
FIG. 11 is a graph of the thermogravimetric change characteristics of an organic semiconductor material according to Example 2 of the present invention.

FIG. 11 is a graph of the thermogravimetric change characteristics of an organic semiconductor material according to Example 2 of the present invention.

From FIG. 11, it can be understood that Compound 2 according to one embodiment of the present invention has a glass transition temperature of about 162° C., which is about two times higher than the glass transition temperature of conventional electron transport layer materials of 79° C.

This shows that the organic semiconductor material according to one embodiment of the present invention can maintain the electron transport ability even at a high temperature.

Figure 12:
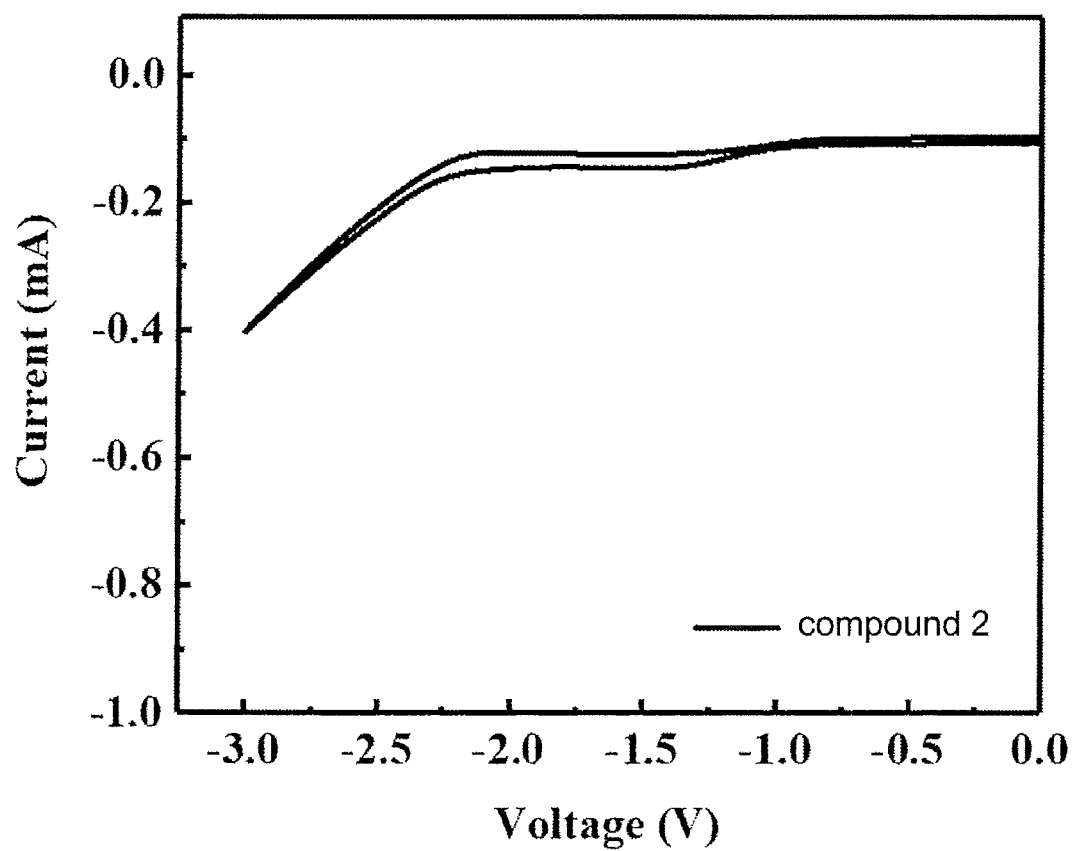
FIG. 12 is a graph of the energy level of an organic semiconductor material according to Example 2 of the present invention.

FIG. 12 is a graph of the energy level of an organic semiconductor material according to Example 2 of the present invention.

From FIG. 12, it can be understood that Compound 2 according to one embodiment of the present invention has a HOMO energy level of −6.71 eV and a LUMO energy level of −3.26 eV and thus has a large HOMO-LUMO gap. This shows that the organic semiconductor material according to one embodiment of the present invention can effectively block the movement of holes.

Figure 13:
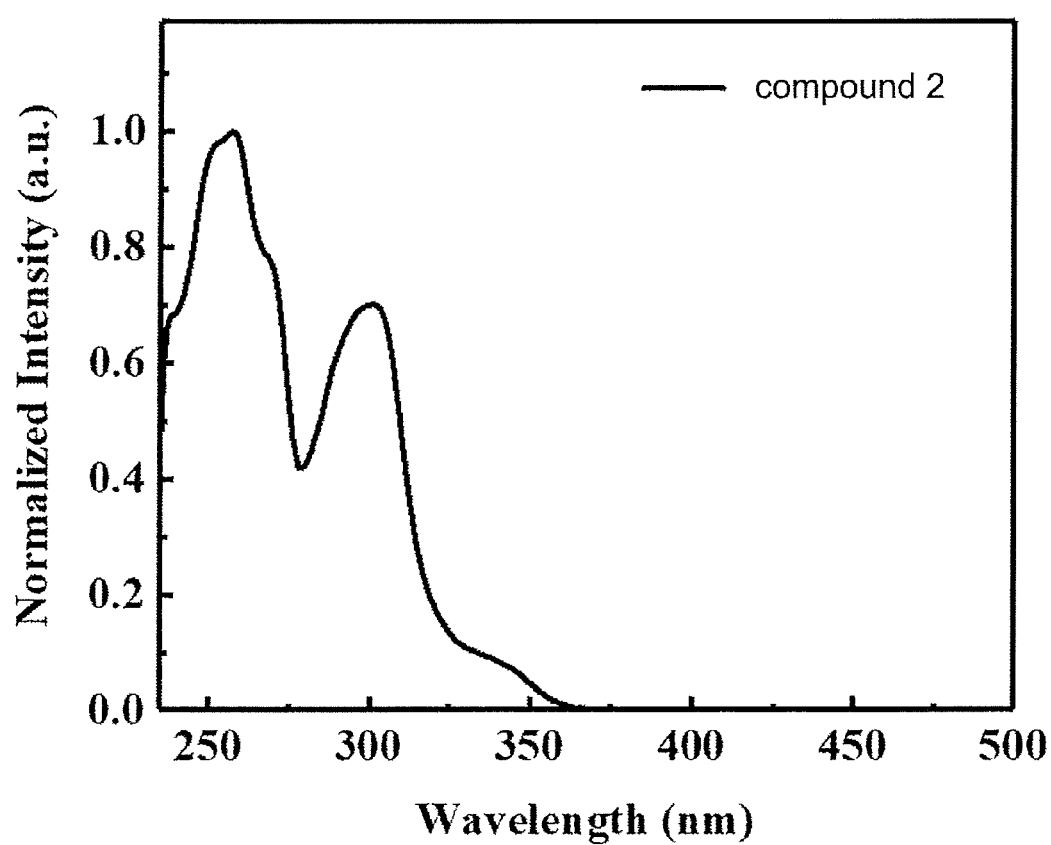
FIG. 13 is a graph of light absorption spectrum of an organic semiconductor material according to Example 2 of the present invention.

FIG. 13 is a graph of a light absorption spectrum of an organic semiconductor material according to Example 2 of the present invention.

From FIG. 13, it can be understood that the band gap energy of Compound 2 according to one embodiment of the present invention is 3.45 eV. This shows that the organic semiconductor material according to one embodiment of the present invention is suitable for application to blue phosphorescent light emitting diodes.

TABLE 1

|  | $T_d$ (° C.) | $T_g$ (° C.) | HOMO (eV) | LUMO (eV) | $E_g$ (eV) |
| --- | --- | --- | --- | --- | --- |
| Compound 2 | 514 | 162 | −6.71 | −3.26 | 3.45 |

Table 1 shows the physical and chemical properties of Compound 2 according to an embodiment of the present invention.

From FIG. 10 to FIG. 13 and Table 1, it can be understood that an organic semiconductor material according to one embodiment of the present invention achieves high thermal stability and high triplet energy, and thus is applicable to blue phosphorescent devices and semiconductor devices.

Example 3

Compound 3 as an organic semiconductor material according to one embodiment of the present invention was synthesized.

<Scheme 3>

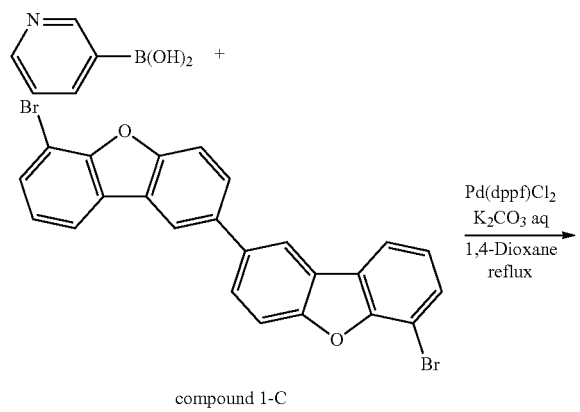

compound 1-C

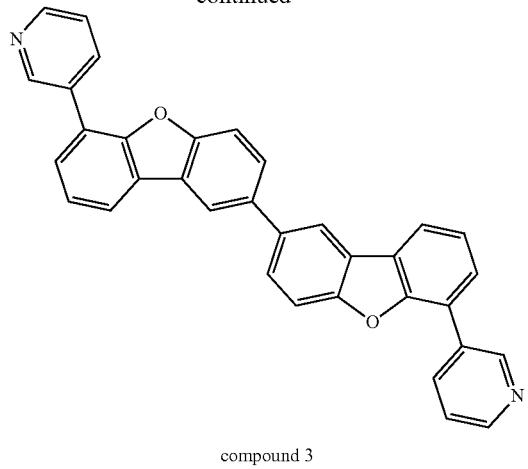

compound 3

With reference to Scheme 3, Compound 1-C (2.00 g, 4.06 mmol), pyridine-3-boronic acid (1.40 g, 11.38 mmol) and potassium carbonate (2.81 g, 20.32 mmol), [1,1′-bis(diphenylphosphino)ferrocene]dichloropalladium-dichloromethane (0.35 g, 0.41 mmol) were first suspended in 100 ml dioxane and 20 ml distilled water. The mixture was then stirred with refluxing under a nitrogen stream for 12 hours to synthesize Compound 3.

Figure 14:
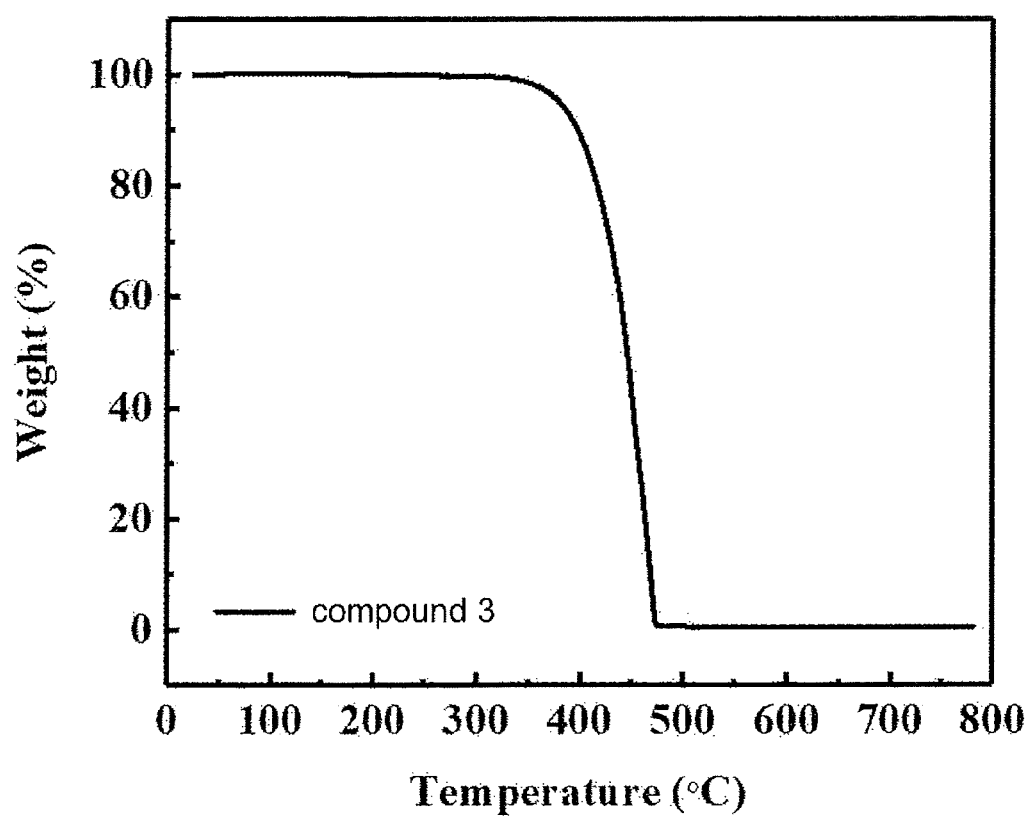
FIG. 14 is a graph of the thermal decomposition characteristics of an organic semiconductor material according to Example 3 of the present invention.

FIG. 14 is a graph of the thermal decomposition characteristics of an organic semiconductor material according to Example 3 of the present invention.

From FIG. 14, it can be understood that Compound 3 according to one embodiment of the present invention is decomposed at about 380° C. This shows that the organic semiconductor material according to one embodiment of the present invention is stable even at a high temperature.

Figure 15:
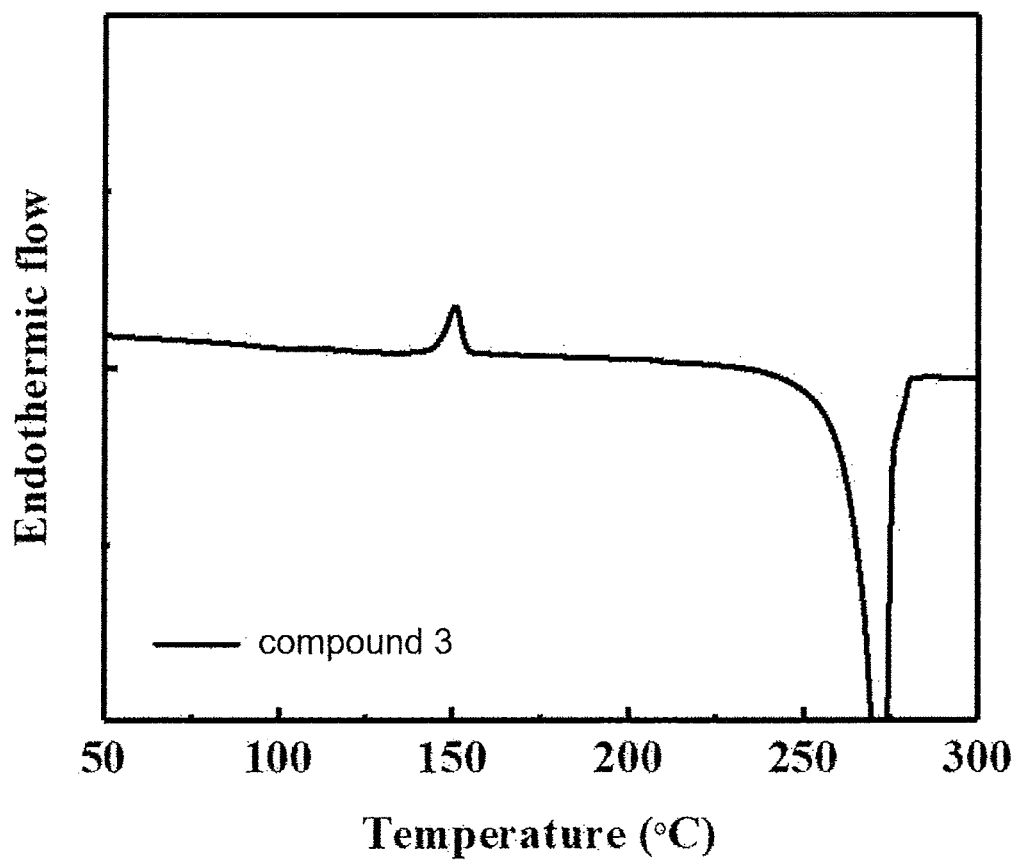
FIG. 15 is a graph of the thermogravimetric change characteristics of an organic semiconductor material according to Example 3 of the present invention.

FIG. 15 is a graph of the thermogravimetric change characteristics of an organic semiconductor material according to Example 3 of the present invention.

From FIG. 15, it can be understood that a glass transition temperature of Compound 3 according to one embodiment of the present invention is not observed.

Figure 16:
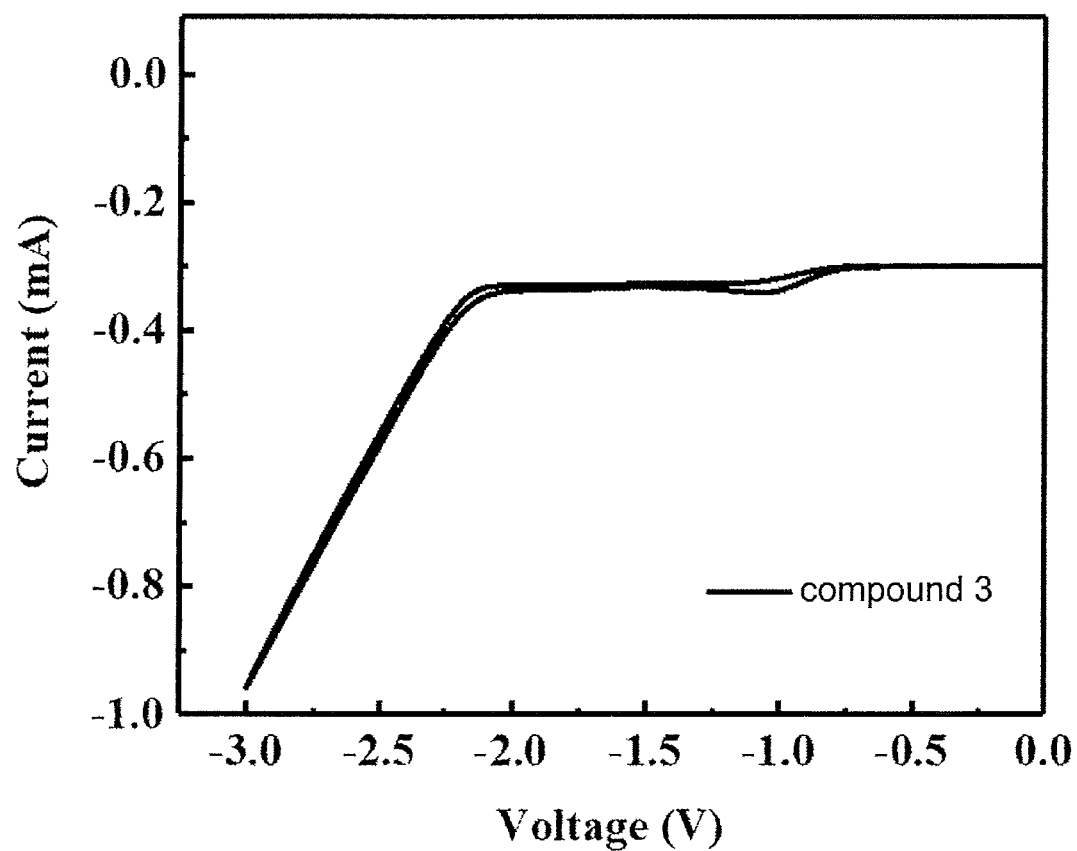
FIG. 16 is a graph of the energy level of an organic semiconductor material according to Example 3 of the present invention.

FIG. 16 is a graph of the energy level of an organic semiconductor material according to Example 3 of the present invention.

From FIG. 16, it can be understood that Compound 3 according to one embodiment of the present invention has a HOMO energy level of −7.14 eV and a LUMO energy level of −3.41 eV and thus has a large HOMO-LUMO gap. This shows that the organic semiconductor material according to one embodiment of the present invention can effectively block the movement of holes.

Figure 17:
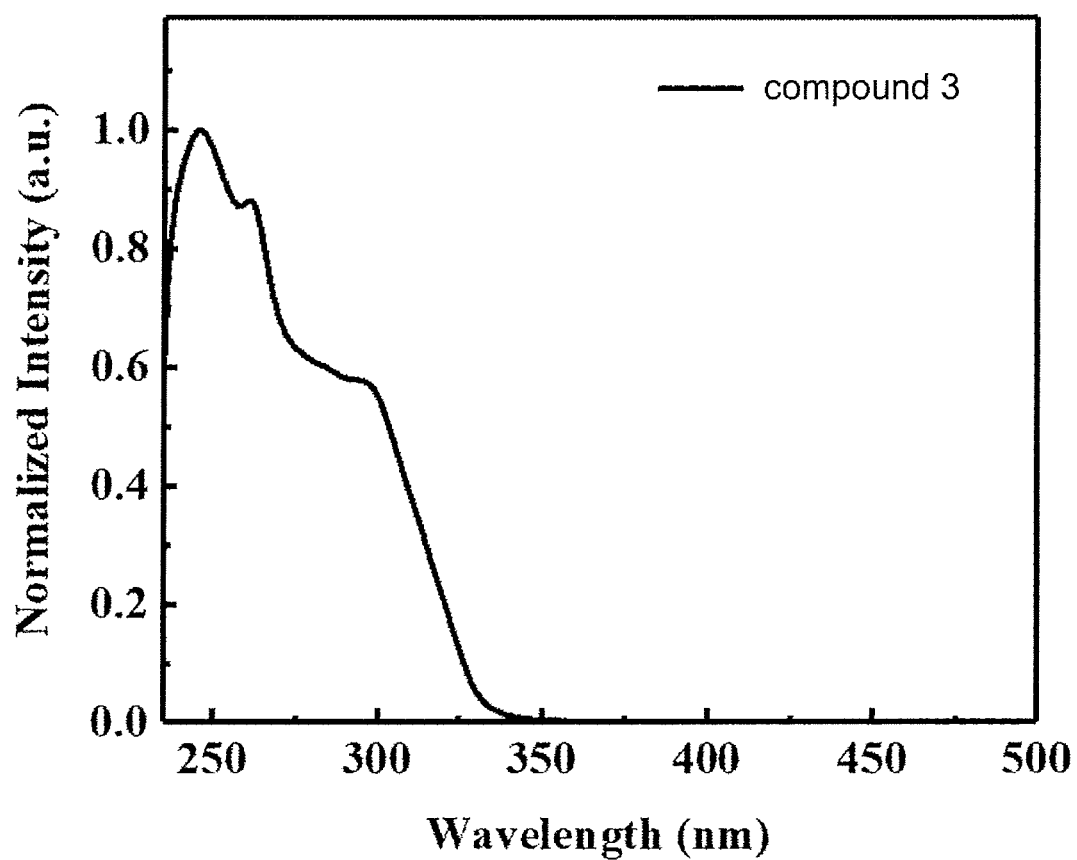
FIG. 17 is a graph of light absorption spectrum of an organic semiconductor material according to Example 3 of the present invention.

FIG. 17 is a graph of a light absorption spectrum of an organic semiconductor material according to Example 3 of the present invention.

From FIG. 17, it can be understood that the band gap energy of Compound 3 according to one embodiment of the present invention is 3.73 eV. This shows that the organic semiconductor material according to one embodiment of the present invention is suitable for application to blue phosphorescent light emitting diodes.

TABLE 2

| | $T_d$ (° C.) | $T_g$ (° C.) | HOMO (eV) | LUMO (eV) | $E_g$ (eV) |
|---|---|---|---|---|---|
| Compound 3 | 380 | not detected | −7.14 | −3.41 | 3.73 |

Table 2 shows the physical and chemical properties of Compound 3 according to an embodiment of the present invention.

From FIG. 14 to FIG. 17 and Table 2, it can be understood that an organic semiconductor material according to one embodiment of the present invention achieves high thermal stability and high triplet energy, and thus is applicable to blue phosphorescent devices and semiconductor devices.

Example 4

Compound 4 as an organic semiconductor material according to one embodiment of the present invention was synthesized.

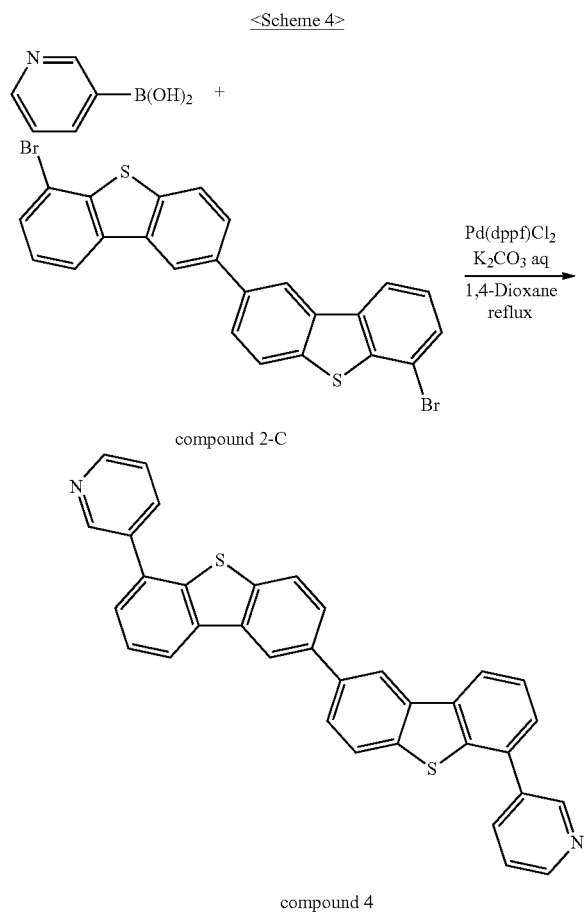

compound 4

With reference to Scheme 4, Compound 2-C (2.00 g, 3.81 mmol), pyridine-3-boronic acid (1.31 g, 10.68 mmol) and potassium carbonate (2.64 g, 19.07 mmol) and [1,1'-bis(diphenylphosphino)ferrocene]dichloropalladium dichloromethane (0.31 g, 0.38 mmol) were suspended in 100 ml dioxane and 20 m distilled water. The mixture was then stirred with refluxing under a nitrogen stream for 12 hours to synthesize Compound 4.

Figure 18:
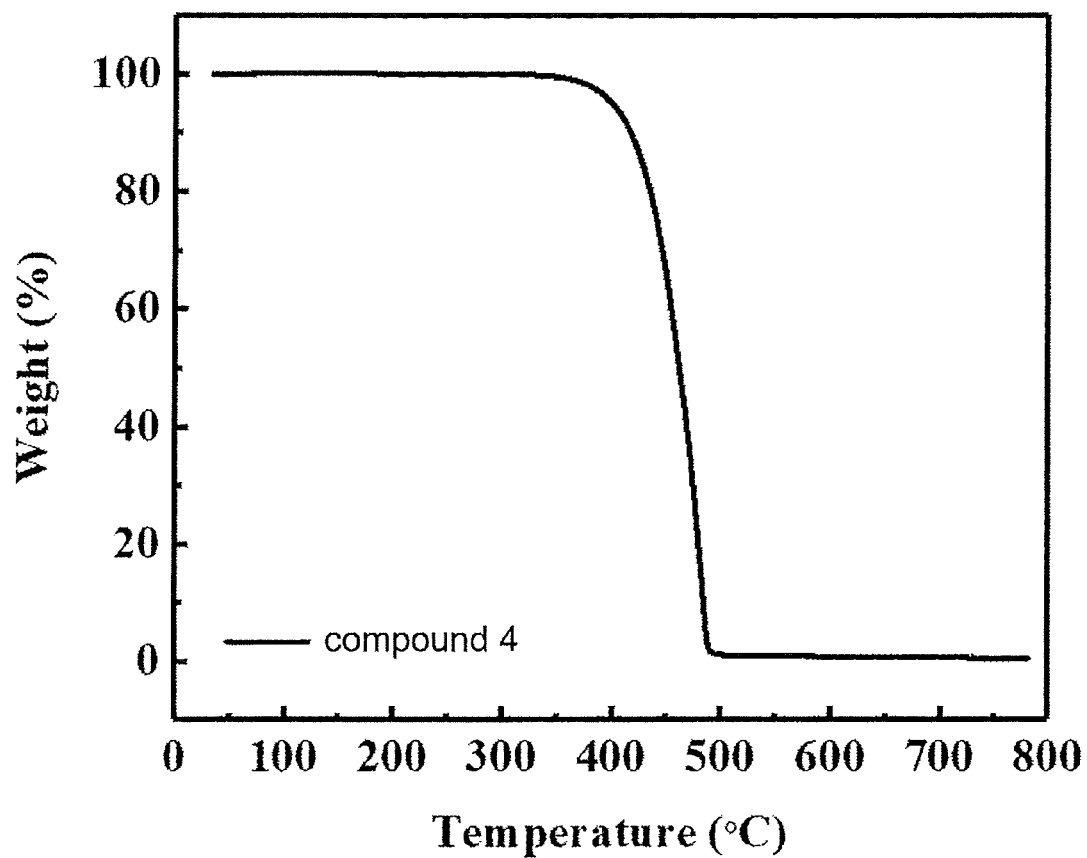
FIG. 18 is a graph of the thermal decomposition characteristics of an organic semiconductor material according to Example 4 of the present invention.

FIG. 18 is a graph of the thermal decomposition characteristics of an organic semiconductor material according to Example 4 of the present invention.

From FIG. 18, it can be understood that Compound 4 according to one embodiment of the present invention is decomposed at about 400° C. This shows that the organic semiconductor material according to one embodiment of the present invention is stable even at a high temperature.

Figure 19:
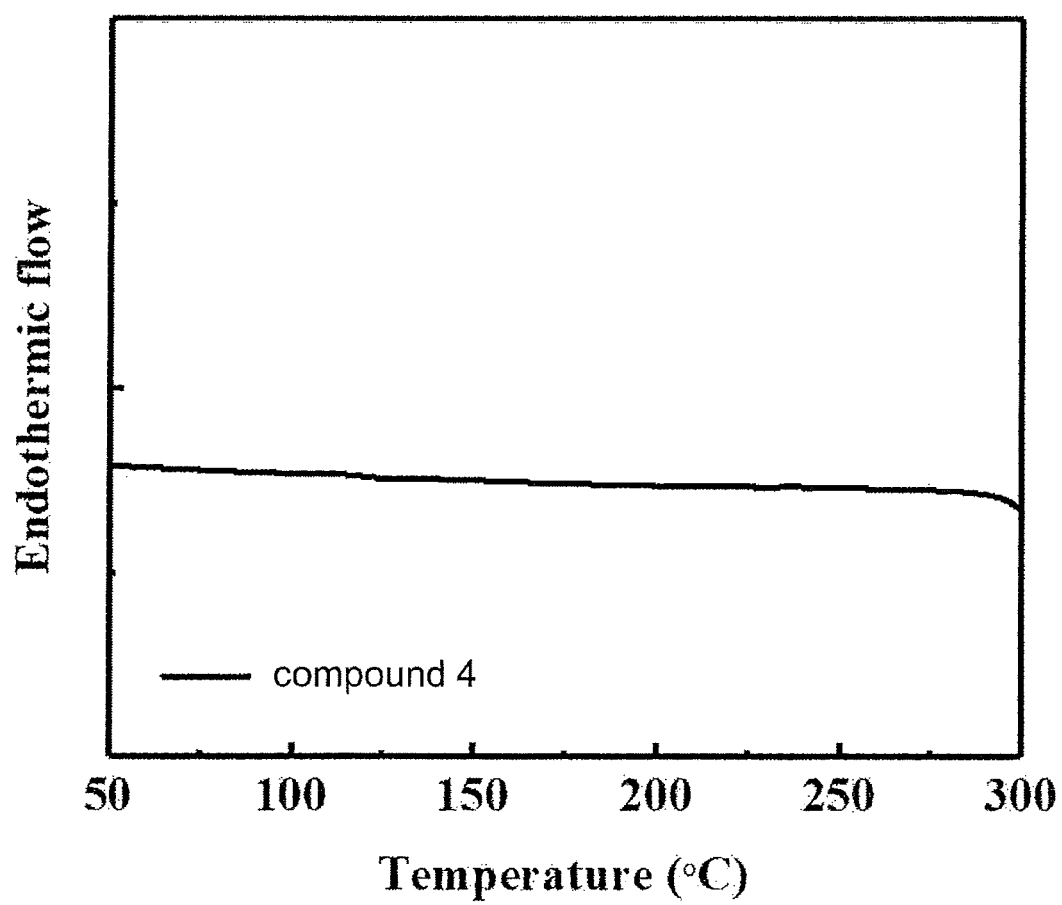
FIG. 19 is a graph of the thermogravimetric change characteristics of an organic semiconductor material according to Example 4 of the present invention.

FIG. 19 is a graph of the thermogravimetric change characteristics of an organic semiconductor material according to Example 4 of the present invention.

From FIG. 19, it can be understood that a glass transition temperature of Compound 4 according to one embodiment of the present invention is not observed. This shows that the organic semiconductor material according to one embodiment of the present invention can maintain the electron transport ability even at a high temperature.

Figure 20:
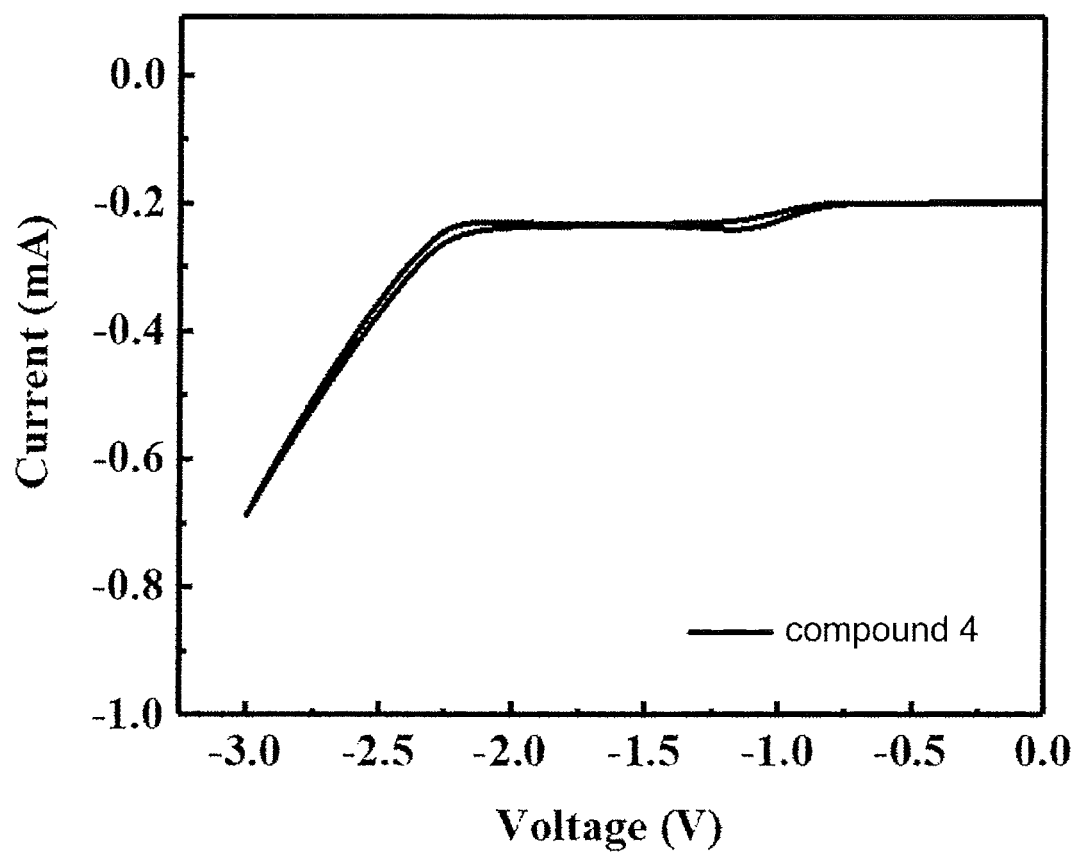
FIG. 20 is a graph of the energy level of an organic semiconductor material according to Example 4 of the present invention.

FIG. 20 is a graph of the energy level of an organic semiconductor material according to Example 4 of the present invention.

From FIG. 20, it can be understood that Compound 4 according to one embodiment of the present invention has a HOMO energy level of −6.90 eV and a LUMO energy level of −3.39 eV and thus has a large HOMO-LUMO gap. This shows that the organic semiconductor material according to one embodiment of the present invention can effectively block the movement of holes.

Figure 21:
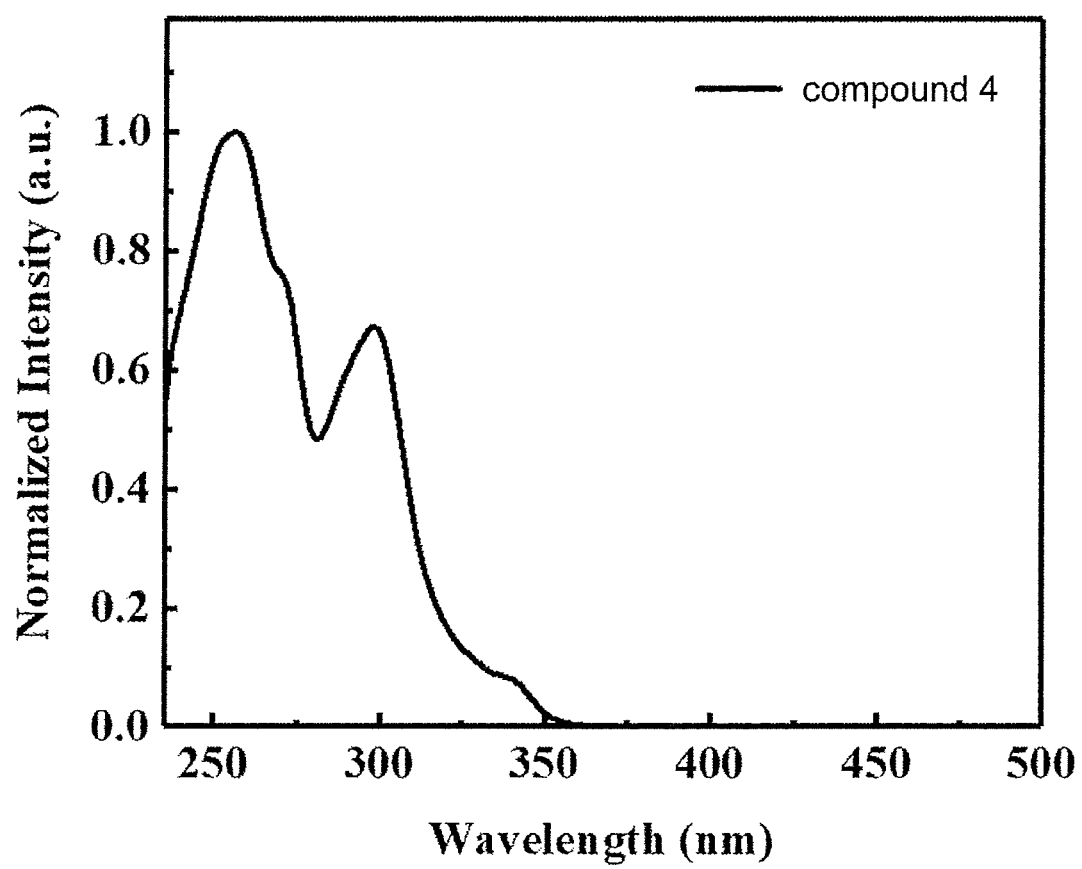
FIG. 21 is a graph of light absorption spectrum of an organic semiconductor material according to Example 4 of the present invention.

FIG. 21 is a graph of a light absorption spectrum of an organic semiconductor material according to Example 4 of the present invention.

From FIG. 21, it can be understood that the band gap energy of Compound 4 according to one embodiment of the present invention is 3.51 eV. This shows that the organic semiconductor material according to one embodiment of the present invention is suitable for application to blue phosphorescent light emitting diodes.

TABLE 3

| | $T_d$ (° C.) | $T_g$ (° C.) | HOMO (eV) | LUMO (eV) | $E_g$ (eV) |
|---|---|---|---|---|---|
| Compound 4 | 400 | not detected | −6.90 | −3.39 | 3.51 |

Table 3 shows the physical and chemical properties of Compound 4 according to an embodiment of the present invention.

From FIG. 18 to FIG. 21 and Table 3, it can be understood that an organic electronic device according to one embodiment of the present invention achieves high thermal stability and high triplet energy, and thus is applicable to blue phosphorescent devices and semiconductor devices.

Figure 22:
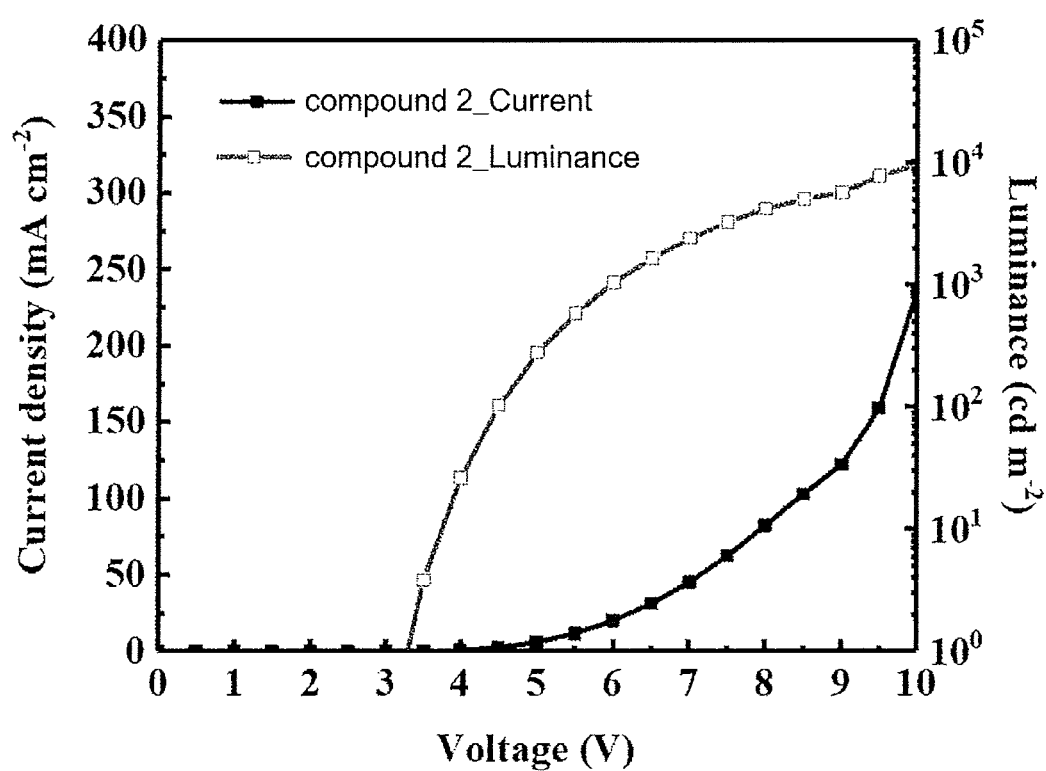
FIG. 22 is a graph of the current density and luminance characteristic vs. voltage of an organic electronic device including the organic semiconductor material according to Example 2 of the present invention.

FIG. 22 is a graph of the current density and luminance characteristic vs. voltage of an organic electronic device including the organic semiconductor material according to Example 2 of the present invention.

From FIG. 22, it can be understood that the current density and luminance increase as the voltage of the organic electronic device increases according to one embodiment of the present invention.

Figure 23:
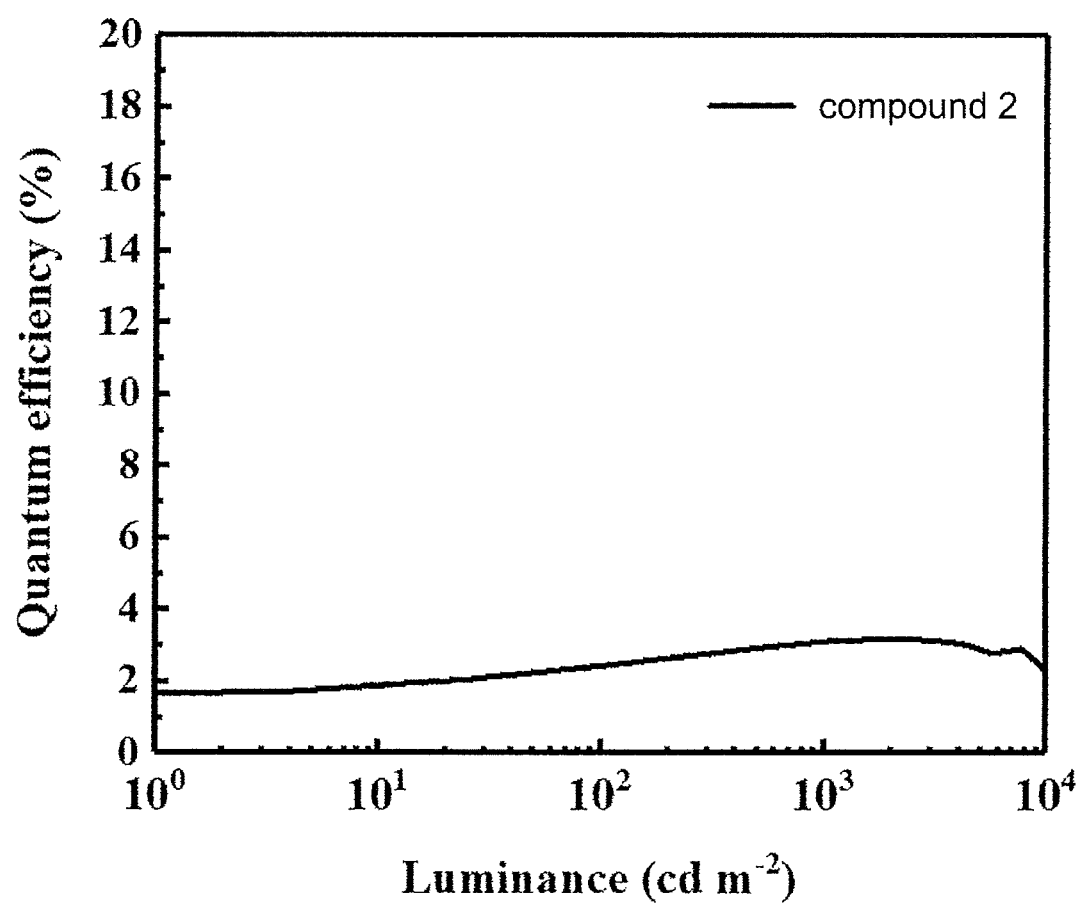
FIG. 23 is a graph of the external quantum efficiency vs. luminance of an organic electronic device including the organic semiconductor material according to Example 2 of the present invention.

FIG. 23 is a graph of the external quantum efficiency vs. luminance of an organic electronic device including the organic semiconductor material according to Example 2 of the present invention.

From FIG. 23, it can be understood that the external quantum efficiency increases as the luminance of the organic electronic device according to one embodiment of the present invention increases.

Figure 24:
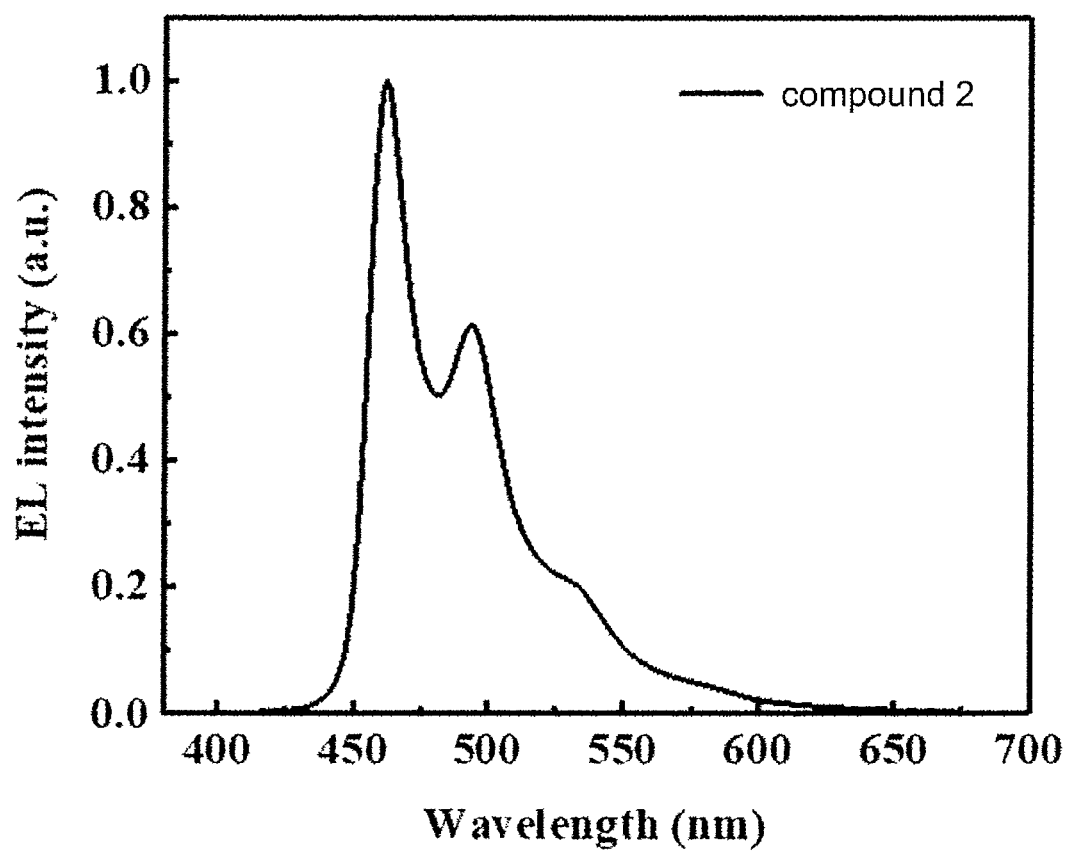
FIG. 24 is a graph of an EL spectrum of an organic electronic device including the organic semiconductor material according to Example 2 of the present invention.

FIG. 24 is an EL spectrum graph of an organic electronic device according to Example 2 of the present invention.

From FIG. 24, it can be understood that an organic light electronic device using an organic semiconductor material according to one embodiment of the present invention as an electron transport material emits blue phosphorescence. This shows that the organic semiconductor material according to one embodiment of the present invention is applicable to blue phosphorescent devices.

TABLE 4

|  | Voltage (V) | Current (mA/cm$^2$) | Luminance (cd/m$^2$) | CIE x | CIE y | EQE (%) 1000 cd | EQE (%) Max | PE (lm/W) 1000 cd | PE (lm/W) Max | CE (Cd/A) 1000 cd | CE (Cd/A) Max |
|---|---|---|---|---|---|---|---|---|---|---|---|
| Compound 2 | 6.0 | 19.4 | 1002.4 | 0.15 | 0.23 | 3.1 | 3.2 | 2.7 | 2.8 | 5.2 | 5.3 |

Table 4 shows the luminescent properties of the organic electronic device including Compound 2 according to one embodiment of the present invention.

From FIG. 22 to FIG. 24 and Table 4, it can be understood that an organic electronic device according to one embodiment of the present invention achieves high thermal stability and high triplet energy by using an organic semiconductor material according to one embodiment of the present invention.

Figure 25:
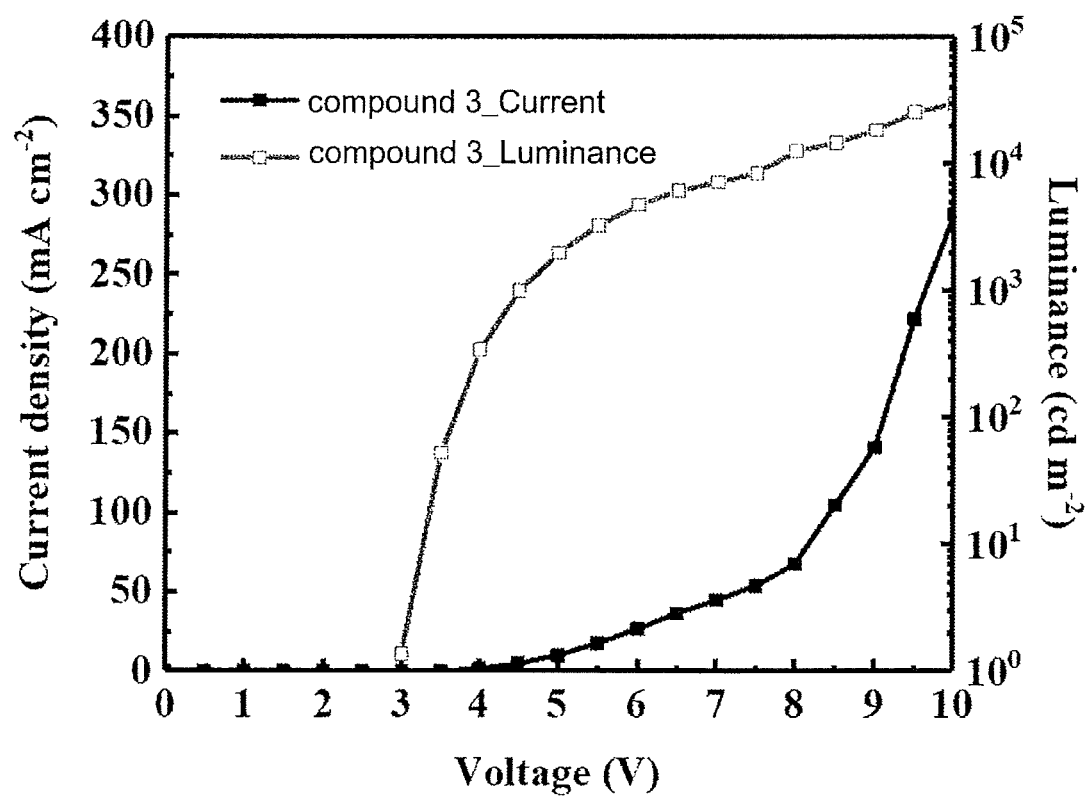
FIG. 25 is a graph of the current density and luminance characteristic vs. voltage of an organic electronic device including the organic semiconductor material according to Example 3 of the present invention.

FIG. 25 is a graph of the current density and luminance characteristic vs. voltage of an organic electronic device including the organic semiconductor material according to Example 3 of the present invention.

From FIG. 25, it can be understood that the current density and luminance increase as the voltage of the organic electronic device according to one embodiment of the present invention increases.

Figure 26:
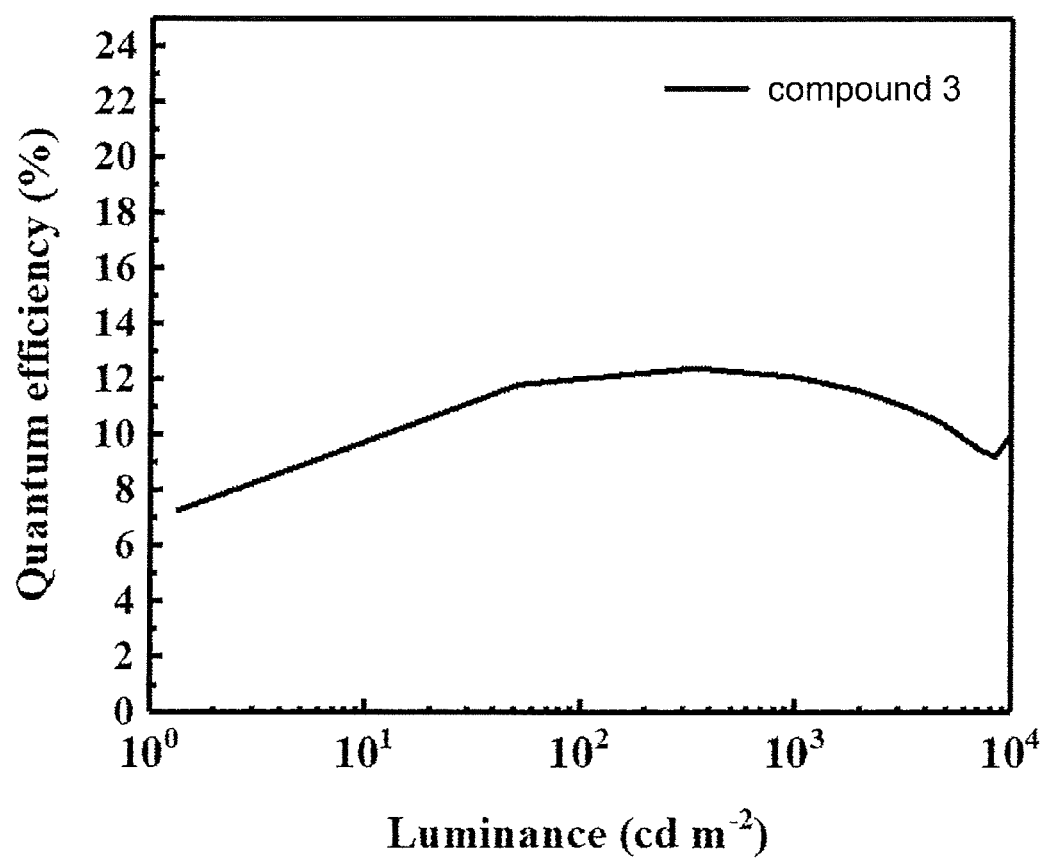
FIG. 26 is a graph of the external quantum efficiency vs. luminance of an organic electronic device including the organic semiconductor material according to Example 3 of the present invention.

FIG. 26 is a graph of the external quantum efficiency characteristics vs. luminance of an organic electronic device including an organic semiconductor material according to Example 3 of the present invention.

From FIG. 26, it can be understood that the external quantum efficiency increases as the luminance of the organic electronic device according to one embodiment of the present invention increases.

Figure 27:
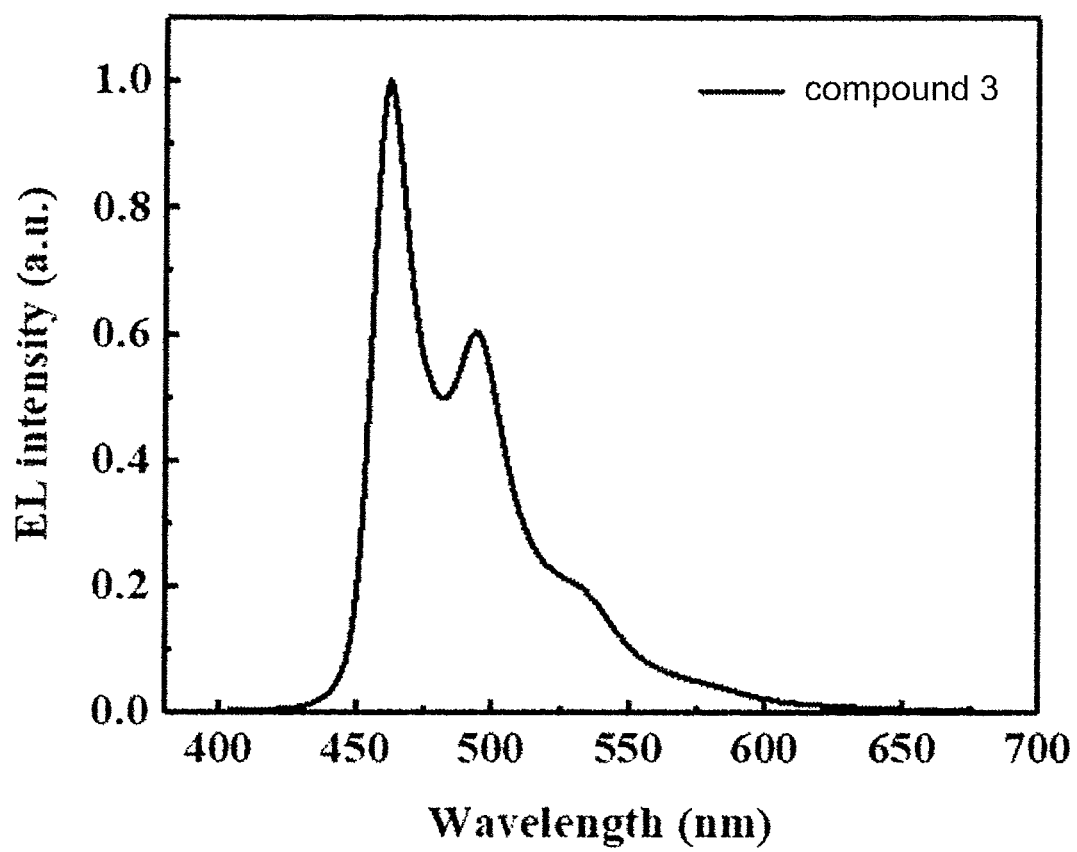
FIG. 27 is a graph of an EL spectrum of an organic electronic device including the organic semiconductor material according to Example 3 of the present invention.

FIG. 27 is a graph of an EL spectrum of an organic electronic device including an organic semiconductor material according to Example 3 of the present invention.

From FIG. 27, it can be understood that an organic electronic device using an organic semiconductor material according to one embodiment of the present invention as an electron transport material emits blue phosphorescence. This shows that the organic semiconductor material according to one embodiment of the present invention is applicable to blue phosphorescent devices.

Table 5 shows the luminescent properties of the organic electronic device including Compound 3 according to one embodiment of the present invention.

From FIG. 25 to FIG. 27 and Table 5, it can be understood that an organic electronic device according to one embodiment of the present invention achieves high thermal stability and high triplet energy by using an organic semiconductor material according to one embodiment of the present invention.

Figure 28:
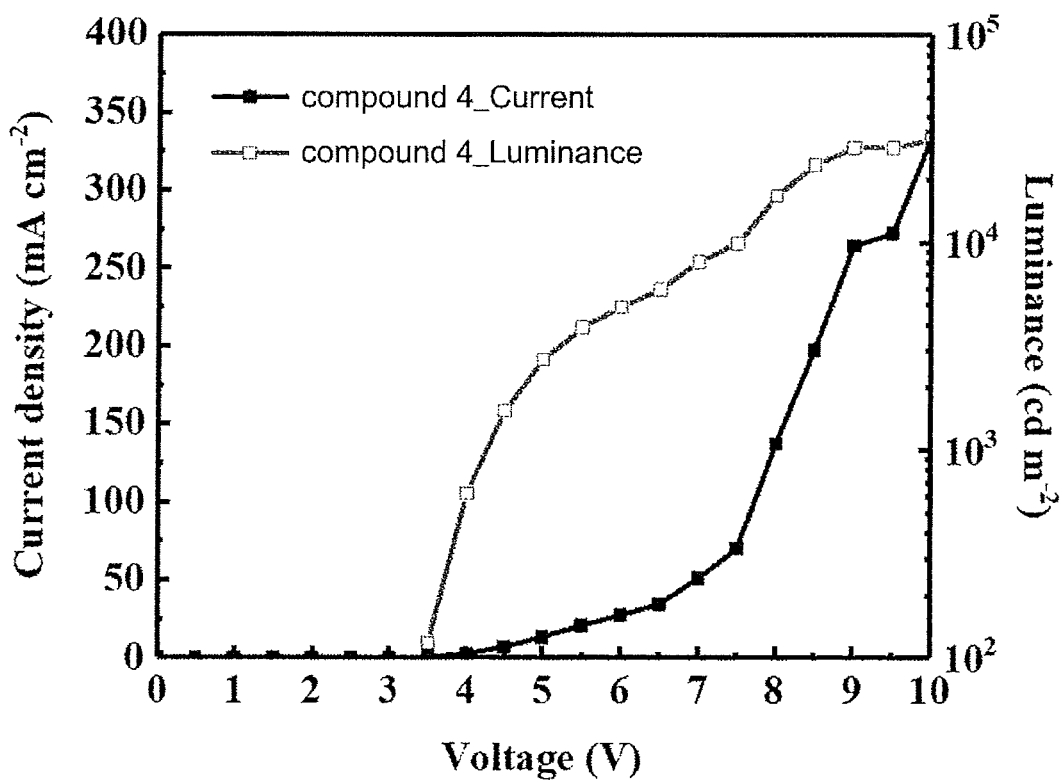
FIG. 28 is a graph of the current density and luminance characteristic vs. voltage of an organic electronic device including the organic semiconductor material according to Example 4 of the present invention.

FIG. 28 is a graph of the current density and luminance characteristic vs. voltage of an organic electronic device including the organic semiconductor material according to Example 4 of the present invention.

From FIG. 28, it can be understood that the current density and luminance increase as the voltage of the organic electronic device according to one embodiment of the present invention increases.

Figure 29:
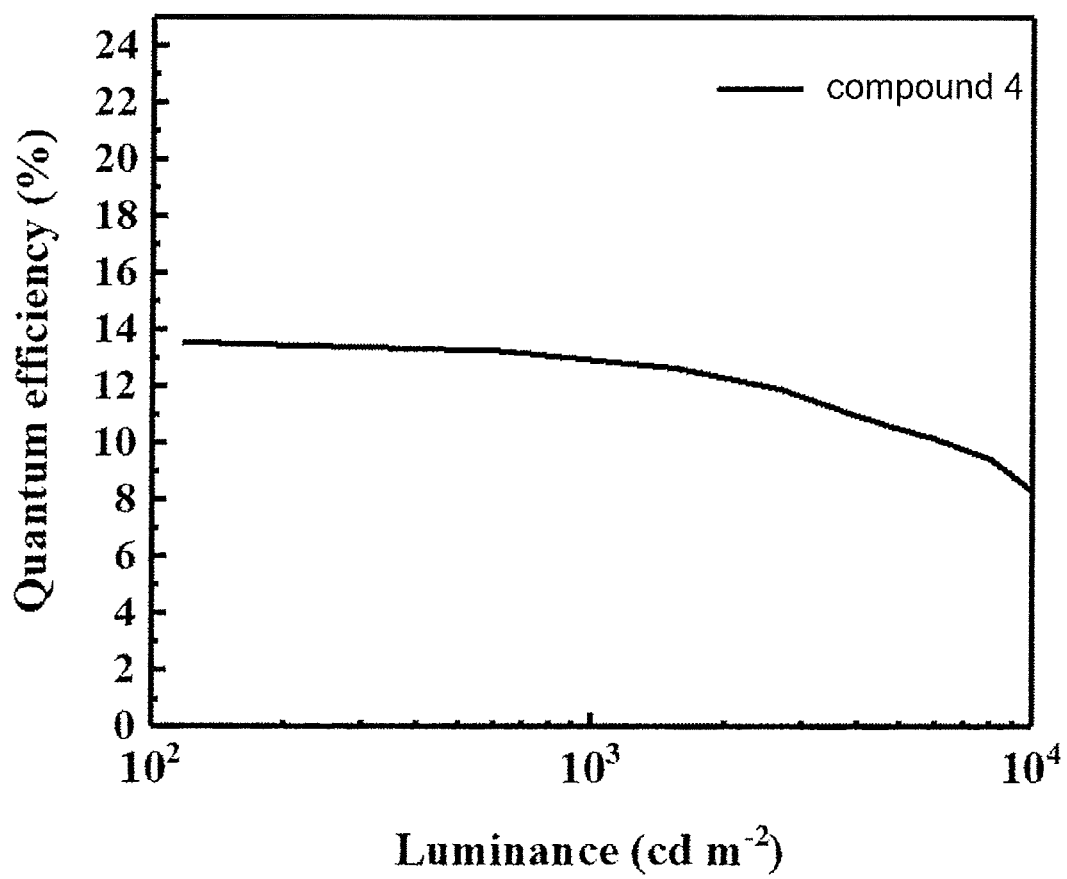
FIG. 29 is a graph of the external quantum efficiency vs. luminance of an organic electronic device including the organic semiconductor material according to Example 4 of the present invention.

FIG. 29 is a graph of the external quantum efficiency characteristics vs. luminance of an organic electronic device including an organic semiconductor material according to Example 4 of the present invention.

From FIG. 29, it can be understood that the organic electronic device according to one embodiment of the present invention maintains an almost constant external quantum efficiency value up to 1000 cd/m$^2$ as the luminance increases, and then the external quantum efficiency is slightly decreased.

Figure 30:
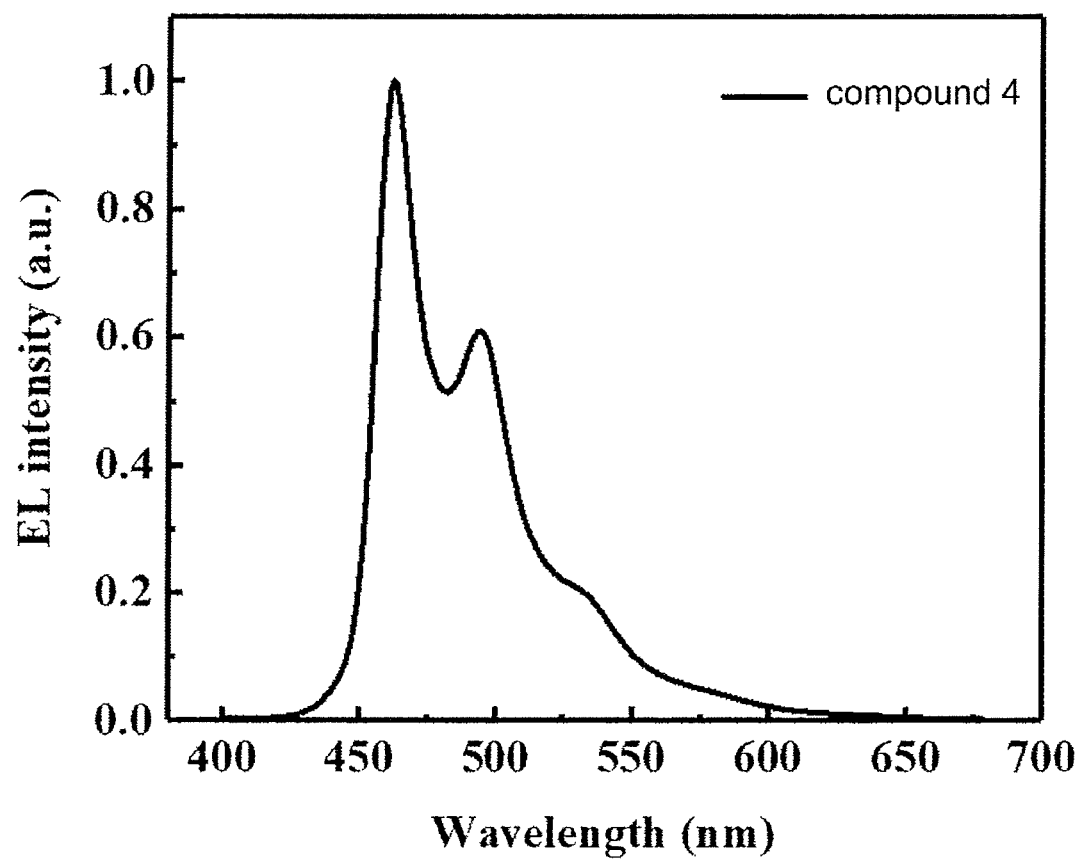
FIG. 30 is a graph of an EL spectrum of an organic electronic device including the organic semiconductor material according to Example 4 of the present invention.

FIG. 30 is a graph of an EL spectrum of an organic electronic device including an organic semiconductor material according to Example 4 of the present invention.

From FIG. 30, it can be understood that an organic electronic device using an organic semiconductor material according to one embodiment of the present invention as an electron transport material emits blue phosphorescence. This means that the organic semiconductor material according to one embodiment of the present invention is applicable to blue phosphorescent devices.

TABLE 5

|  | Voltage (V) | Current (mA/cm$^2$) | Luminance (cd/m$^2$) | CIE x | CIE y | EQE (%) 1000 cd | EQE (%) Max | PE (lm/W) 1000 cd | PE (lm/W) Max | CE (Cd/A) 1000 cd | CE (Cd/A) Max |
|---|---|---|---|---|---|---|---|---|---|---|---|
| Compound 3 | 4.5 | 4.9 | 997.5 | 0.15 | 0.24 | 12.1 | 12.4 | 14.3 | 17.9 | 20.4 | 20.9 |

TABLE 6

| | Voltage (V) | Current (mA/cm$^2$) | Luminance (cd/m$^2$) | CIE | | EQE (%) | | PE (lm/W) | | CE (Cd/A) | |
|---|---|---|---|---|---|---|---|---|---|---|---|
| | | | | x | y | 1000 cd | Max | 1000 cd | Max | 1000 cd | Max |
| Compound 4 | 4.2 | 4.7 | 1009.1 | 0.15 | 0.24 | 13.0 | 13.6 | 16.4 | 20.5 | 21.9 | 22.8 |

Table 6 shows the luminescent properties of the organic electronic device including Compound 4 according to one embodiment of the present invention.

From FIG. 28 to FIG. 30 and Table 6, it can be understood that an organic electronic device according to one embodiment of the present invention achieves high thermal stability and high triplet energy by using an organic semiconductor material according to one embodiment of the present invention.

According to one embodiment of the present invention, it is possible to provide an organic semiconductor material having high triplet energy.

According to one embodiment of the present invention, it is possible to provide an organic semiconductor material having high thermal stability.

According to one embodiment of the present invention, it is possible to provide an organic electronic device having high triplet energy.

According to one embodiment of the present invention, it is possible to provide an organic electronic device having high thermal stability.

It should be understood that the effects of the present invention are not limited to the effects described above but include all effects that can be deduced from the detailed description of the present invention or the constitution of the invention described in the claims.

It will be understood by a person skilled in the art that the embodiments of the invention described herein are for illustrative purposes only, and that various changes may be made therein without departing from the technical idea or essential features of the present invention. It is therefore to be understood that the above-described embodiments are illustrative in all aspects and not restrictive. For example, each component described to be of a single type can be implemented in a distributed manner. Likewise, components described to be distributed can be implemented in a combined manner.

The scope of the present invention is defined by the appended claims, and all changes or modifications derived from the meaning and scope of the claims and their equivalents should be construed as being included within the scope of the present invention.

What is claimed is:

1. An organic semiconductor material for electron transport represented by a Formula 1:

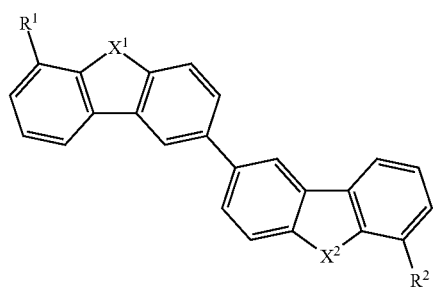

[Formula 1]

wherein $X^1$ and $X^2$ are oxygen (O), wherein $R^1$ and $R^2$ each independently contain a fluoropyridine group, a diphenylthiazole group, a phenylthiadiazole group, a phenyloxadiazole group, a diphenyltriazole group, a pyrimidylbenzene group, or a phenylpyrimidine group, and wherein, if at least one of $R^1$ and $R^2$ is the fluoropyridine group, the fluoropyridine group is selected from groups represented by a Formula 4,

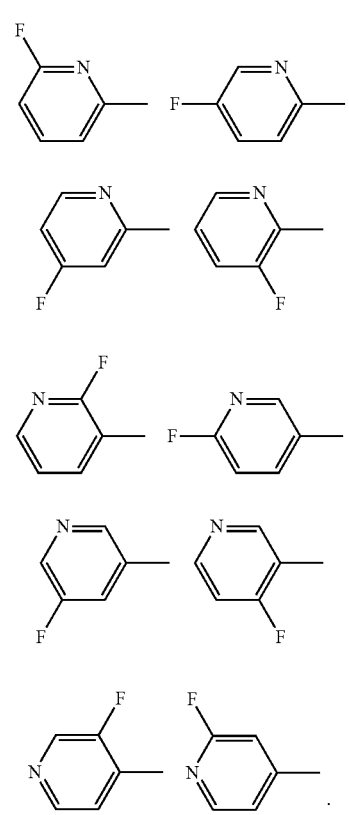

[Formula 4]

2. The organic semiconductor material according to claim 1, wherein, in Formula 1, at least one of $R^1$ and $R^2$ is the fluoropyridine group, and the fluoropyridine group is selected from the groups represented by the Formula 4.

3. The organic semiconductor material according to claim 1, wherein, in Formula 1, at least one of $R^1$ and $R^2$ is the diphenylthiazole group, and the diphenylthiazole group is selected from groups represented by a Formula 5:

[Formula 5]

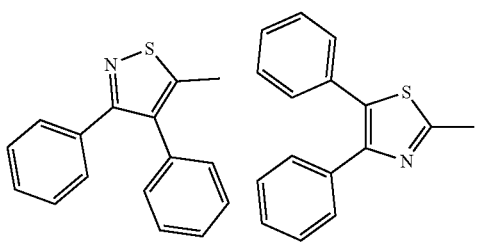

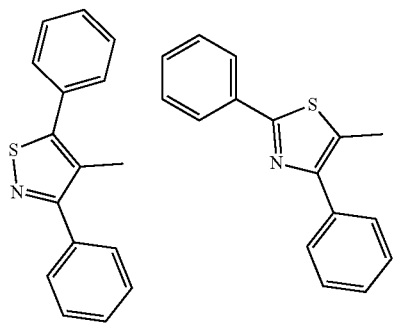

4. The organic semiconductor material according to claim 1, wherein, in Formula 1, at least one of R¹ and R² is the phenylthiadiazole group, and the phenylthiadiazole group is selected from groups represented by a Formula 8:

[Formula 8]

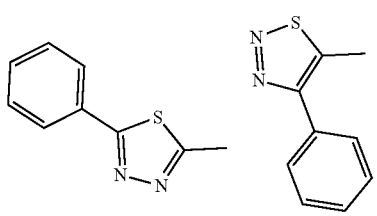

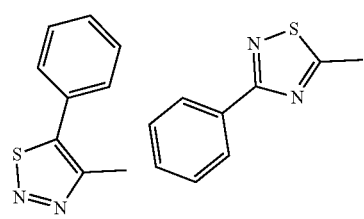

-continued

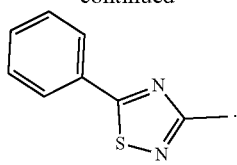

5. The organic semiconductor material according to claim 1, wherein, in Formula 1, at least one of R¹ and R² is the phenyloxadiazole group, and the phenyloxadiazole group is selected from groups represented by a Formula 9:

[Formula 9]

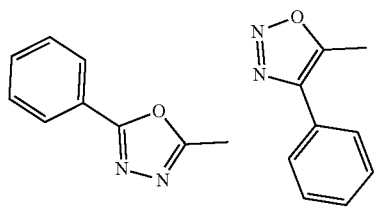

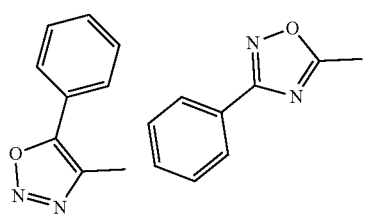

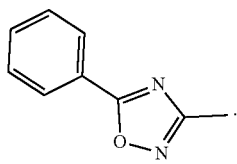

6. The organic semiconductor material according to claim 1, wherein, in Formula 1, at least one of R¹ and R² is the diphenyltriazole group, and the diphenyltriazole group is selected from groups represented by a Formula 10:

[Formula 10]

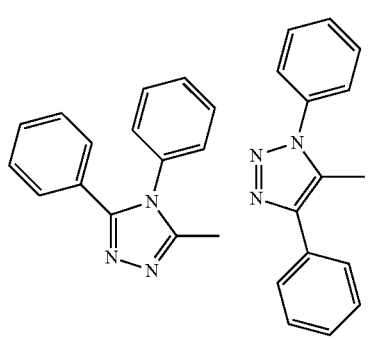

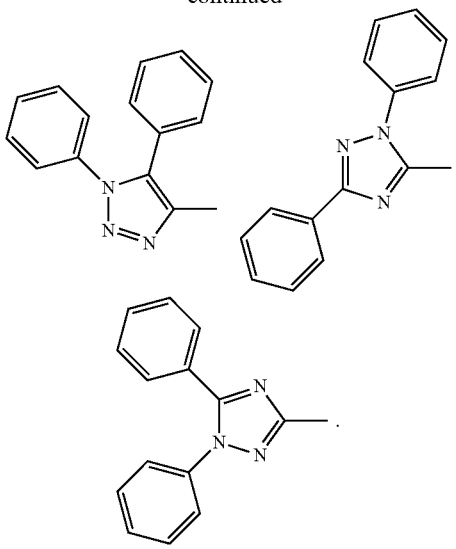

7. The organic semiconductor material according to claim 1,
wherein, in Formula 1, at least one of $R^1$ and $R^2$ is the pyrimidylbenzene group, and
the pyrimidylbenzene group is selected from groups represented by a Formula 12:

[Formula 12]

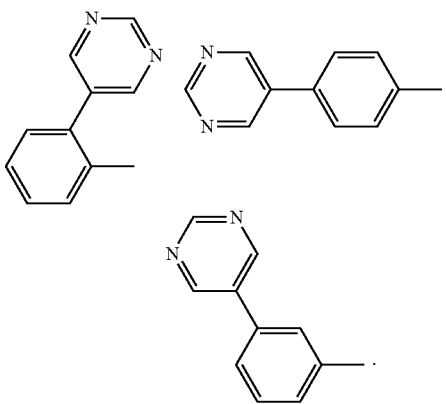

8. The organic semiconductor material according to claim 1,
wherein in Formula 1, at least one of $R^1$ and $R^2$ is the phenylpyrimidine group, and
the phenylpyrimidine group is selected from groups represented by a Formula 13:

[Formula 13]

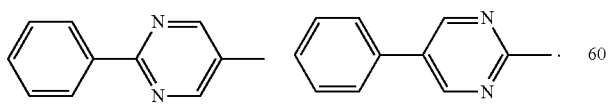

9. The organic semiconductor material according to claim 1,
wherein the fluoropyridine group, the diphenylthiazole group, the phenylthiadiazole group, the phenyloxadiazole group, the diphenyltriazole group, the pyrimidylbenzene group, or the phenylpyrimidine group is unsubstituted or substituted with a substituent,
and the substituent is at least one selected from the group consisting of —OH, —NR₃R₄, —CONR₃R₄, —COR₅, —COOR₆ wherein $R_3$ and $R_4$ each independently represent hydrogen, an alkyl group having 1 to 30 carbon atoms, an aryl group having 6 to 30 carbon atoms, or a heteroaryl group having 2 to 30 carbon atoms; $R_5$ represents hydrogen, a hydroxyl group, a halogen, an alkyl group having 1 to 30 carbon atoms, an aryl group having 6 to 30 carbon atoms or a heteroaryl group having 2 to 30 carbon atoms; and $R_6$ represents an alkyl group having 1 to 30 carbon atoms, an aryl group having 6 to 30 carbon atoms, or a heteroaryl group having 2 to 30 carbon atoms, a hydroxyalkyl group having 1 to 30 carbon atoms, a heteroaryl group having 2 to 30 carbon atoms and containing nitrogen or oxygen, a halogen, a nitro group, a cyano group, an alkyl group having 1 to 30 carbon atoms, an alkenyl group having 1 to 30 carbon atoms, an alkynyl group having 1 to 30 carbon atoms, an alkoxy group having 1 to 30 carbon atoms, an alkoxyalkyl group having 1 to 30 carbon atoms, an aryl group having 6 to 30 carbon atoms, an arylalkyl group having 6 to 30 carbon atoms and a cycloalkyl group having 5 to 30 carbon atoms.

10. An organic electronic device comprising:
the organic semiconductor material according to claim 1.

11. The organic electronic device according to claim 10, configured as an organic light emitting diode comprising:
the organic semiconductor material arranged as an electron transport layer for transfer of electrons from a cathode layer to an emissive layer.

12. An organic semiconductor material for electron transport represented by a Formula 1:

[Formula 1]

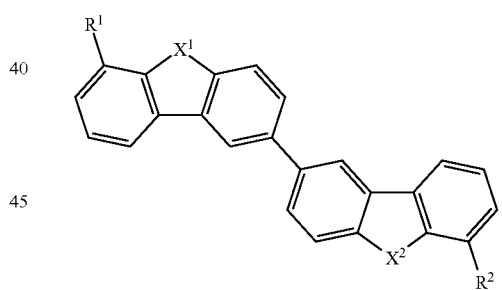

wherein $X^1$ and $X^2$ are oxygen (O), and $R^1$ and $R^2$ each independently are a a fluoropyridine group, a diphenylthiazole group, a phenylthiadiazole group, a phenyloxadiazole group, a diphenyltriazole group, a pyrimidylbenzene group, or a phenylpyrimidine group, and
wherein, if at least one of $R^1$ and $R^2$ is the fluoropyridine group, the fluoropyridine group is selected from groups represented by a Formula 4,

[Formula 4]

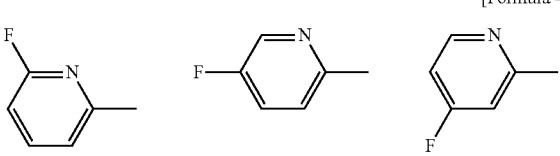

-continued
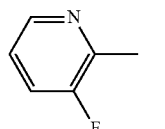 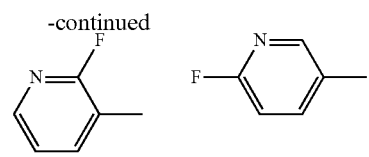
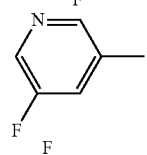 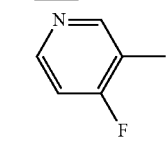 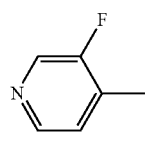
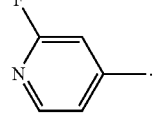.
* * * * *